(12) United States Patent
Wu et al.

(10) Patent No.: US 12,336,250 B2
(45) Date of Patent: Jun. 17, 2025

(54) SEMICONDUCTOR DEVICE STRUCTURE AND METHOD FOR FORMING THE SEMICONDUCTOR DEVICE STRUCTURE

(71) Applicant: Taiwan Semiconductor Manufacturing Company, Ltd., Hsinchu (TW)

(72) Inventors: Shao-Jyun Wu, Hsinchu (TW); Yung Feng Chang, Hsinchu (TW); Tung-Heng Hsieh, Hsinchu (TW); Bao-Ru Young, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 453 days.

(21) Appl. No.: 17/746,409

(22) Filed: May 17, 2022

(65) Prior Publication Data
US 2023/0378318 A1    Nov. 23, 2023

(51) Int. Cl.
| | | |
|---|---|---|
| H10D 64/01 | (2025.01) | |
| H01L 21/02 | (2006.01) | |
| H10D 30/01 | (2025.01) | |
| H10D 30/67 | (2025.01) | |
| H10D 62/10 | (2025.01) | |

(52) U.S. Cl.
CPC ....... *H10D 64/017* (2025.01); *H01L 21/0259* (2013.01); *H10D 30/031* (2025.01); *H10D 30/6735* (2025.01); *H10D 30/6757* (2025.01); *H10D 62/118* (2025.01)

(58) Field of Classification Search
CPC ........... H01L 29/66545; H01L 21/0259; H01L 29/0665; H01L 29/42392; H01L 29/66742; H01L 29/78696; H10D 64/017; H10D 30/6735; H10D 30/6757; H10D 62/118; H10D 64/252; H10D 84/0188; H10D 84/903
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |

(Continued)

*Primary Examiner* — Syed I Gheyas
(74) *Attorney, Agent, or Firm* — Birch, Stewart, Kolasch & Birch, LLP

(57) ABSTRACT

A method for forming a semiconductor device structure includes forming a fin structure with alternating stacked first semiconductor layers and second semiconductor layers over a substrate. The method also includes forming a cladding layer over the fin structure. The method also includes forming a fin isolation structure beside the cladding layer. The method also includes forming a capping layer over the fin isolation structure. The method also includes forming a dummy gate structure across the capping layer. The method also includes patterning the dummy gate structure. The method also includes patterning the capping layer by using the dummy gate structure as a mask layer. The method also includes removing the dummy gate structure.

20 Claims, 49 Drawing Sheets

(56) References Cited

U.S. PATENT DOCUMENTS

| | | |
|---|---|---|
| 9,576,814 B2 | 2/2017 | Wu et al. |
| 9,608,116 B2 | 3/2017 | Ching et al. |
| 2012/0309139 A1* | 12/2012 | Liang ................ H01L 29/66795 |
| | | 257/E21.409 |
| 2020/0243666 A1* | 7/2020 | Ching ............... H01L 29/66439 |
| 2021/0159311 A1* | 5/2021 | Lan ................. H01L 21/823431 |

* cited by examiner

SEMICONDUCTOR DEVICE STRUCTURE AND METHOD FOR FORMING THE SEMICONDUCTOR DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes.

However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2P-1, 2P-3, 2Q-1, 2R-1, 2T-1 are cross-sectional representations of various stages of forming a semiconductor device structure, in accordance with some embodiments of the disclosure.

FIGS. 2P-2, 2Q-2, 2R-2 are cross-sectional representations of various stages of forming a semiconductor device structure, in accordance with some embodiments of the disclosure.

FIG. 2P-4 is a top view of a semiconductor device structure, in accordance with some embodiments of the disclosure.

FIGS. 3A-1, 3B-1 are cross-sectional representations of various stages of forming a semiconductor device structure, in accordance with some embodiments of the disclosure.

FIGS. 3A-2, 3B-2 are cross-sectional representations of various stages of forming a semiconductor device structure, in accordance with some embodiments of the disclosure.

FIG. 4A-1 is a top view of a semiconductor device structure, in accordance with some embodiments of the disclosure.

FIGS. 4A-2 and 4B are cross-sectional representations of various stages of forming a semiconductor device structure, in accordance with some embodiments of the disclosure.

FIG. 5A-1 is a top view of a semiconductor device structure, in accordance with some embodiments of the disclosure.

FIGS. 5A-2 and 5B-5C are cross-sectional representations of various stages of forming a semiconductor device structure, in accordance with some embodiments of the disclosure.

FIGS. 7A-1, 7B-1, 7C are cross-sectional representations of various stages of forming a semiconductor device structure, in accordance with some embodiments of the disclosure.

FIGS. 7A-2, 7B-2 are cross-sectional representations of various stages of forming a semiconductor device structure, in accordance with some embodiments of the disclosure.

DETAILED DESCRIPTION

Figure 1:
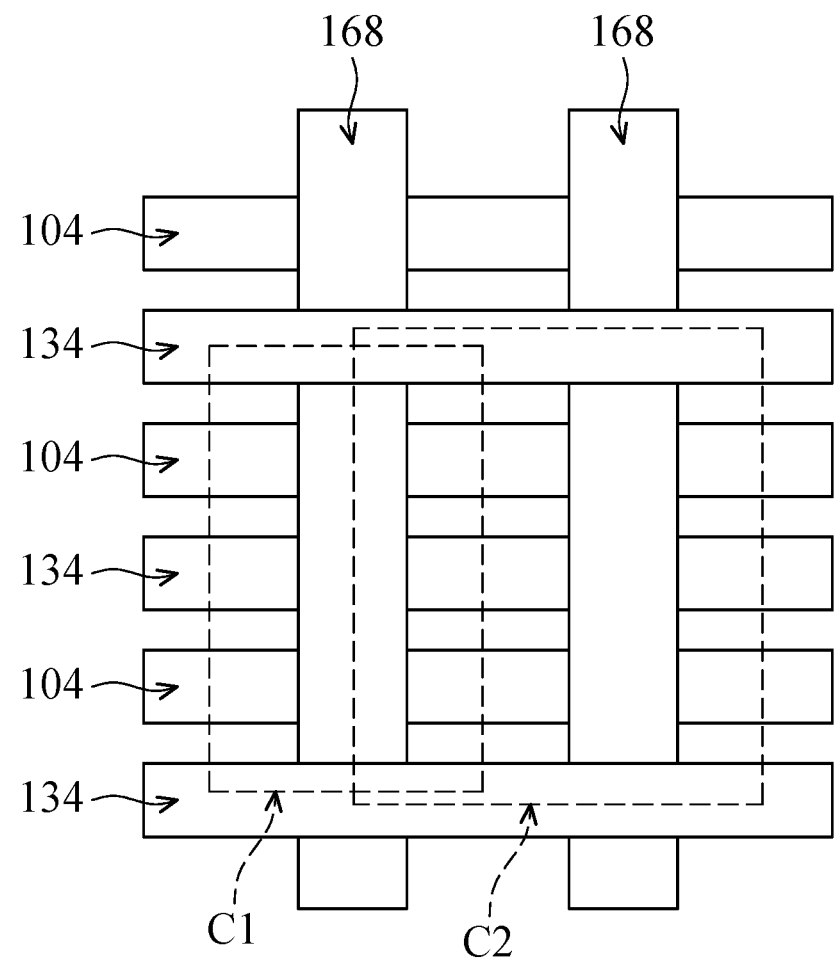
FIG. 1 is a top view of a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments for forming a semiconductor device structure are provided. The method for forming the semiconductor device structure may include using the capping layer over the fin isolation structures to isolate adjacent gate structures. The capping layer over the fin isolation structures may be patterned by the dummy gate structures. The top portion of the capping layer may be trimmed. Therefore, the placement of the gate contact structure may be more flexible, and device cell height may be reduced. In addition, the gate structures may be formed at a lower aspect ratio.

FIG. 1 is a top view of a semiconductor structure 10a in accordance with some embodiments. FIG. 1 has been simplified for the sake of clarity to better understand the inventive concepts of the present disclosure. Additional features may be added in the semiconductor structure 10a, and some of the features described below may be replaced, modified, or eliminated.

The semiconductor structure 10a may include multi-gate devices and may be included in a microprocessor, a memory, or other IC devices. For example, the semiconductor structure 10a may be a portion of an IC chip that include various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other applicable component, or a combination thereof.

Figure 2A:
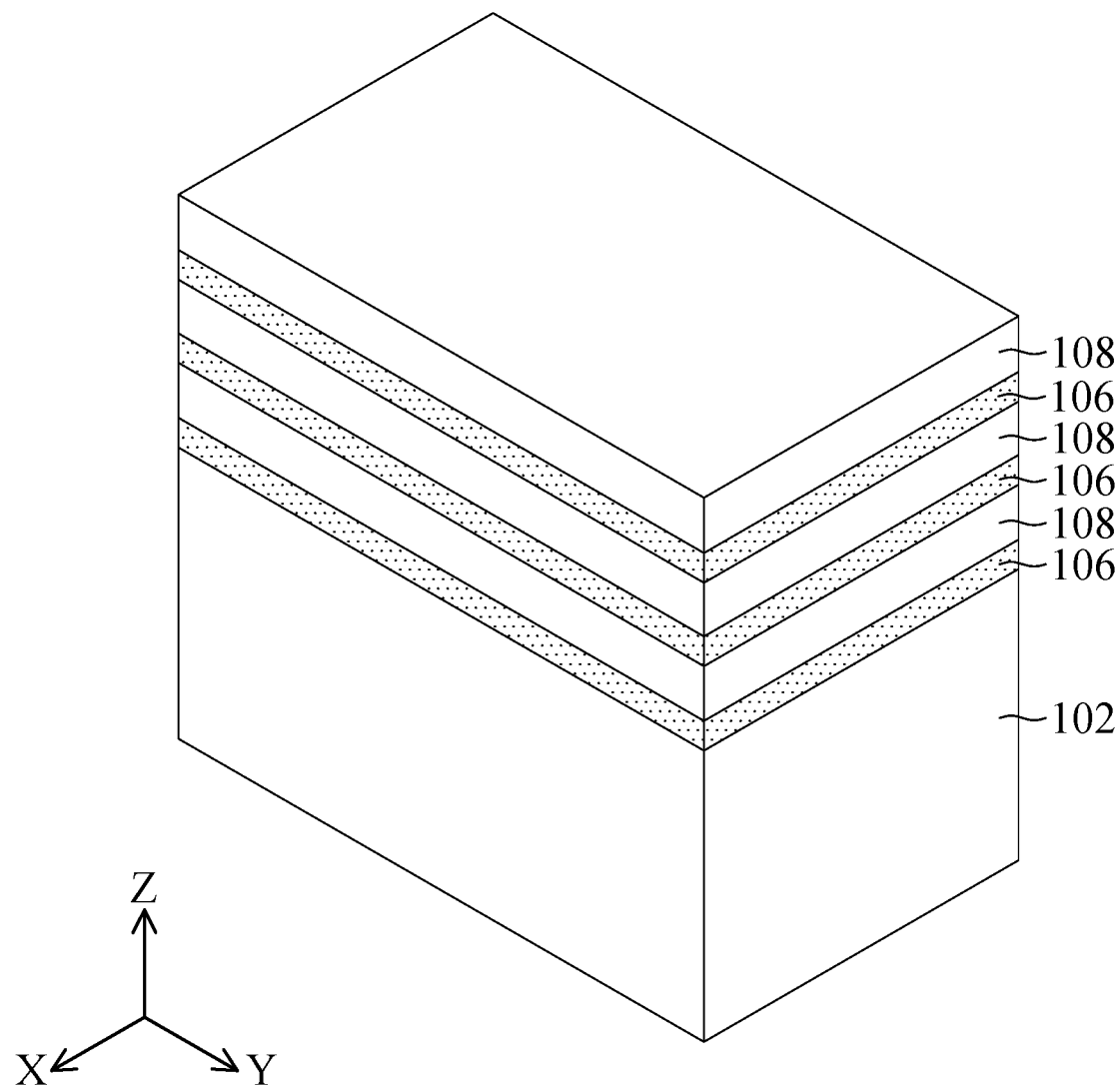
FIGS. 2A-2T are perspective representations of various stages of forming a semiconductor device structure, in accordance with some embodiments of the disclosure.
Figure 2B:
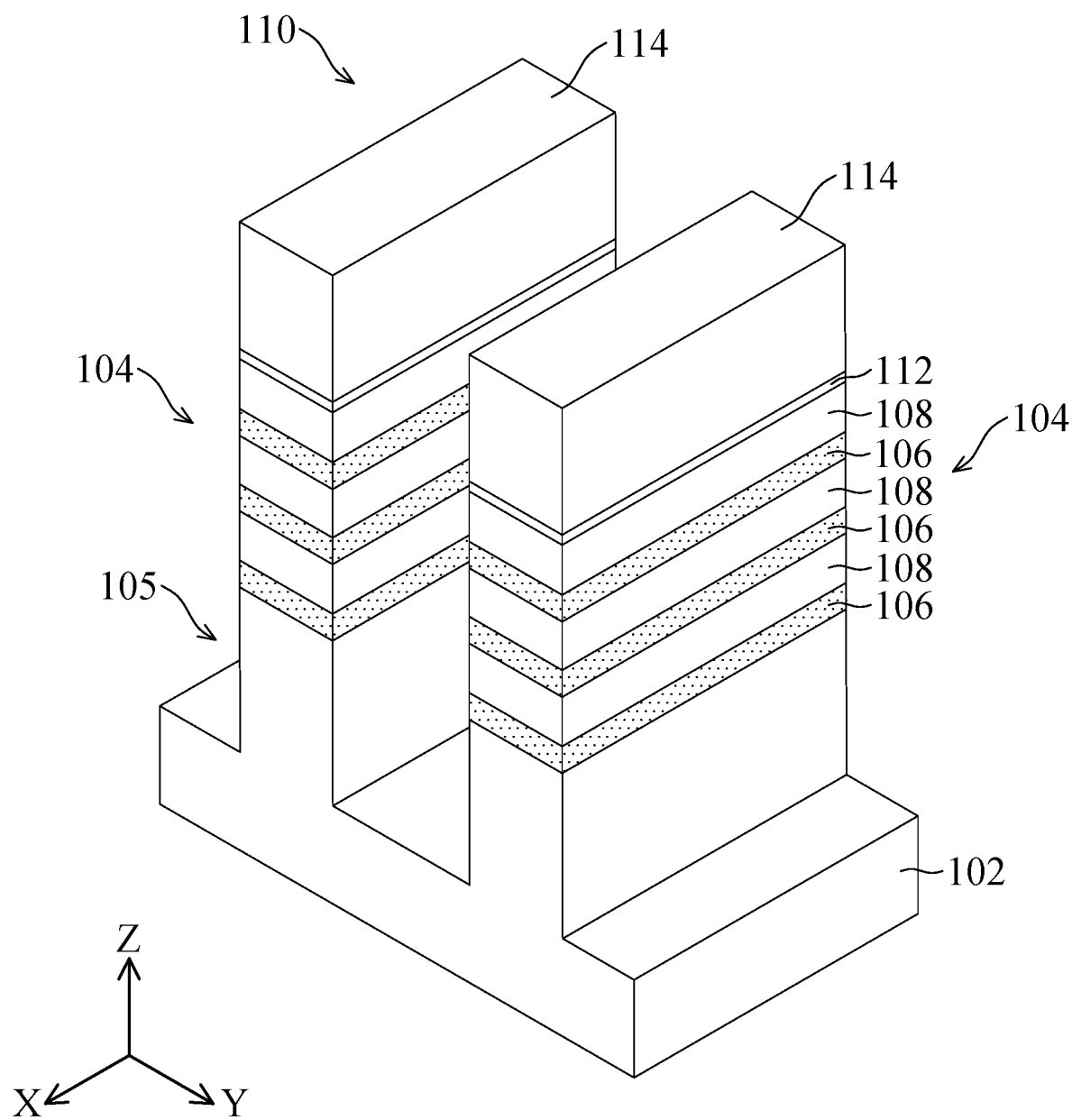
Figure 2C:
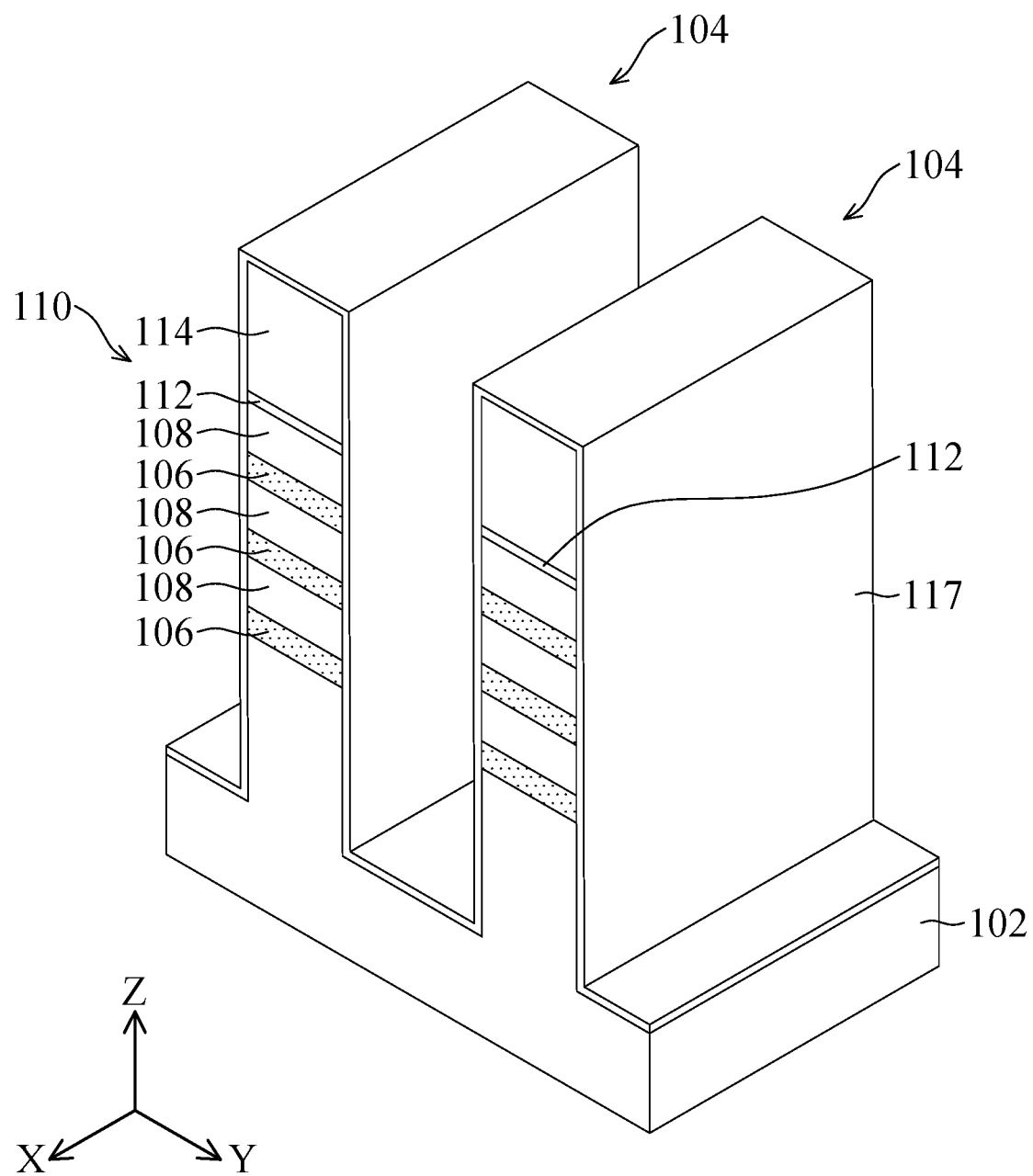
Figure 2D:
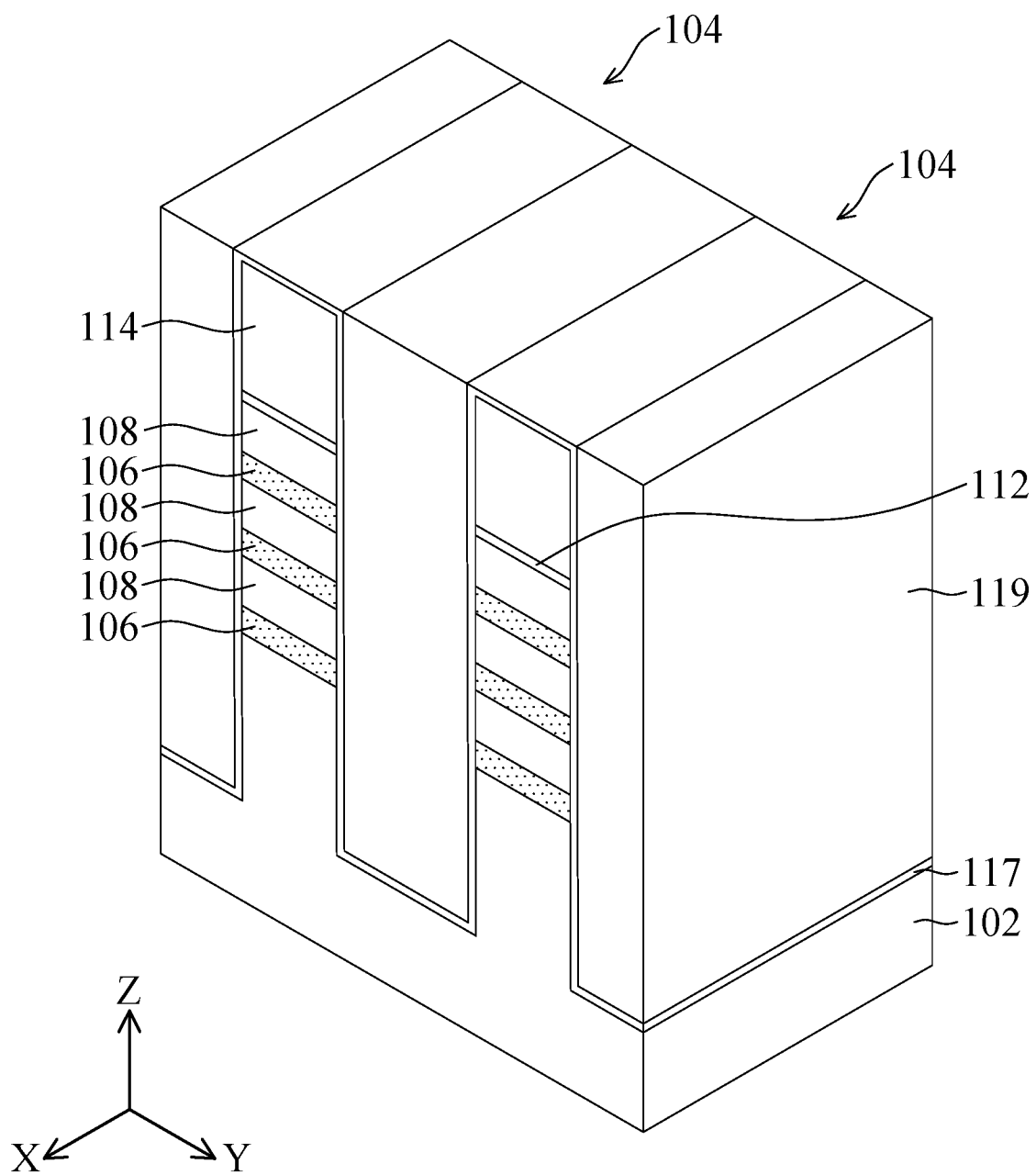
Figure 2E:
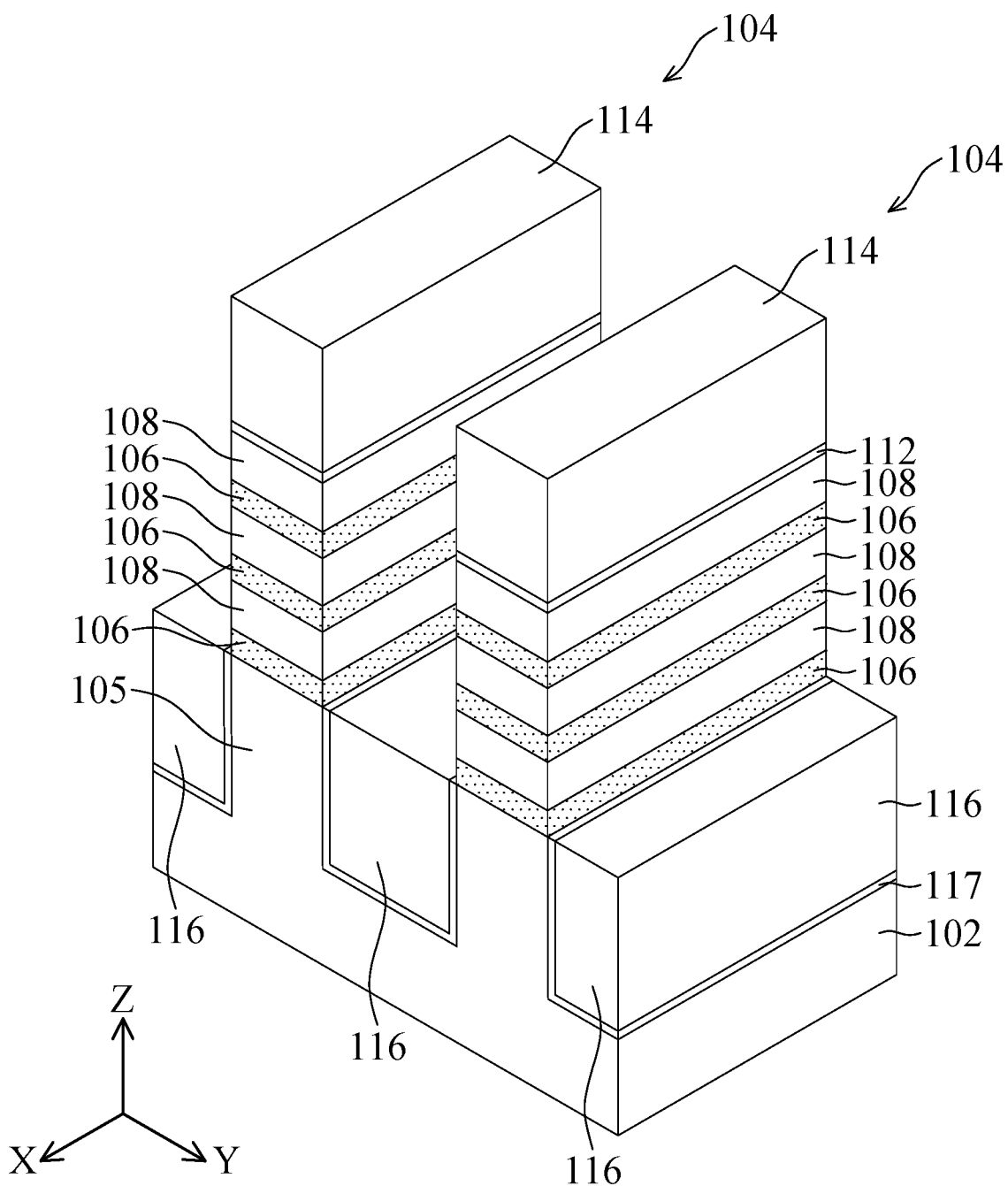
Figure 2F:
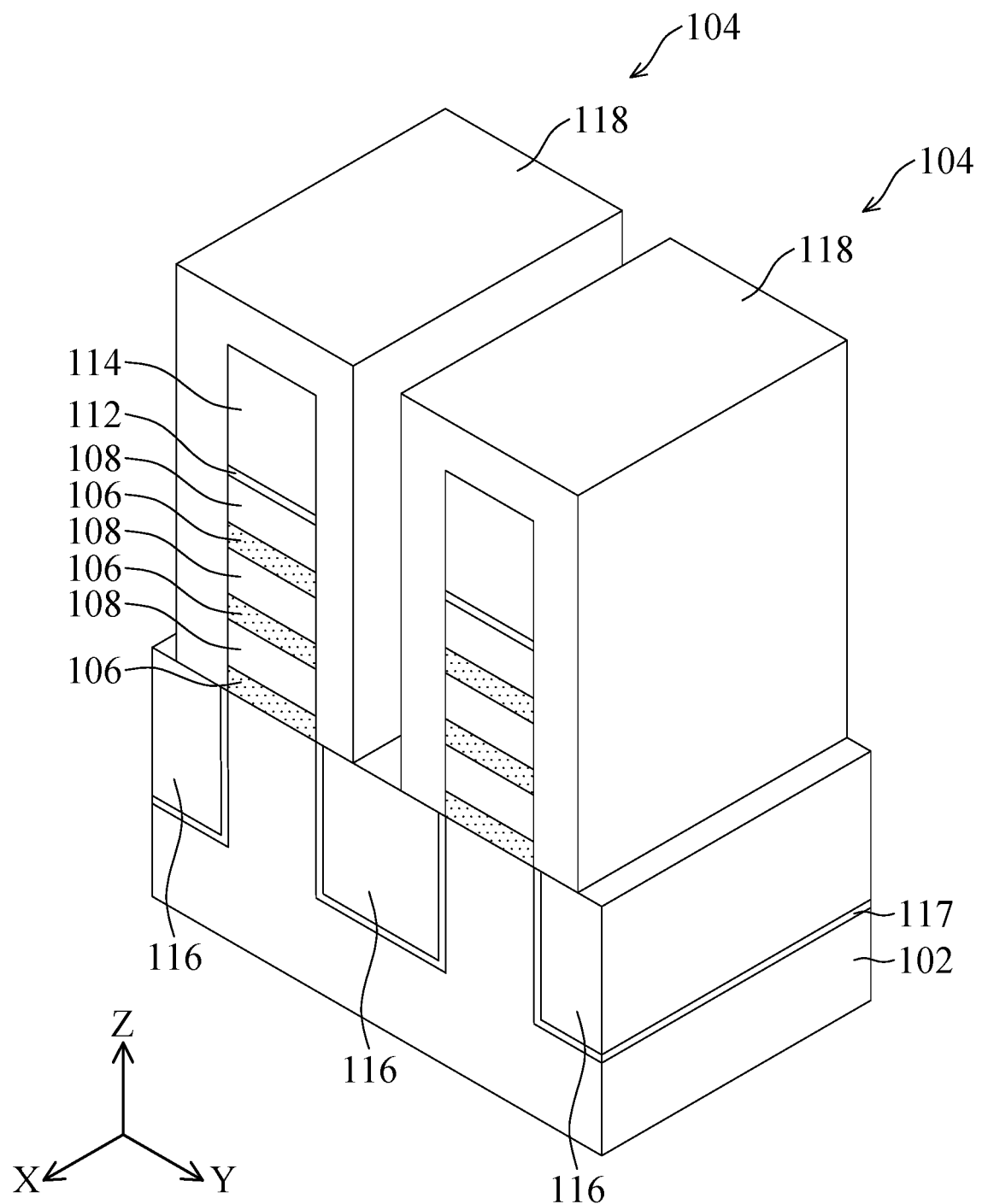
Figure 2G:
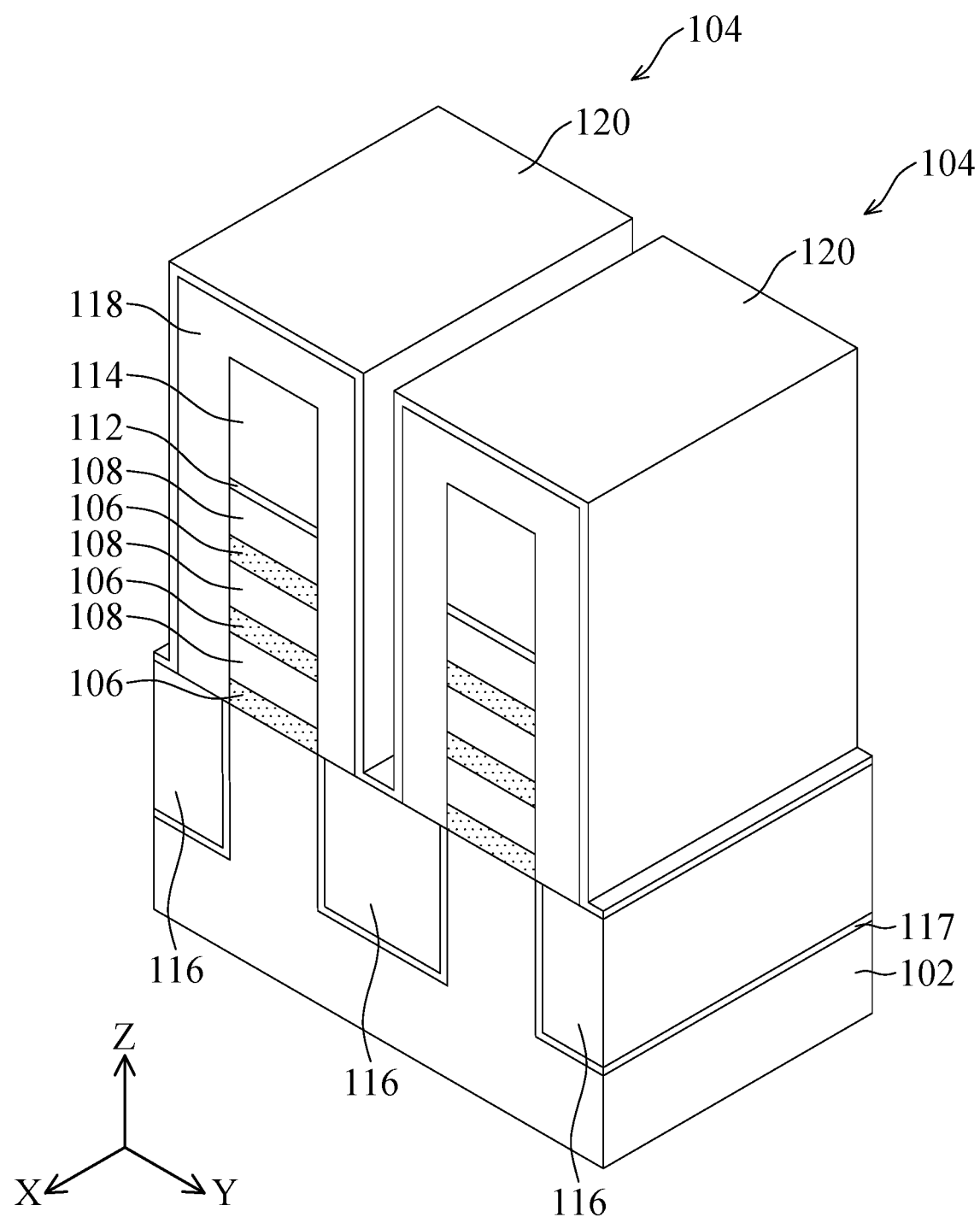
Figure 2H:
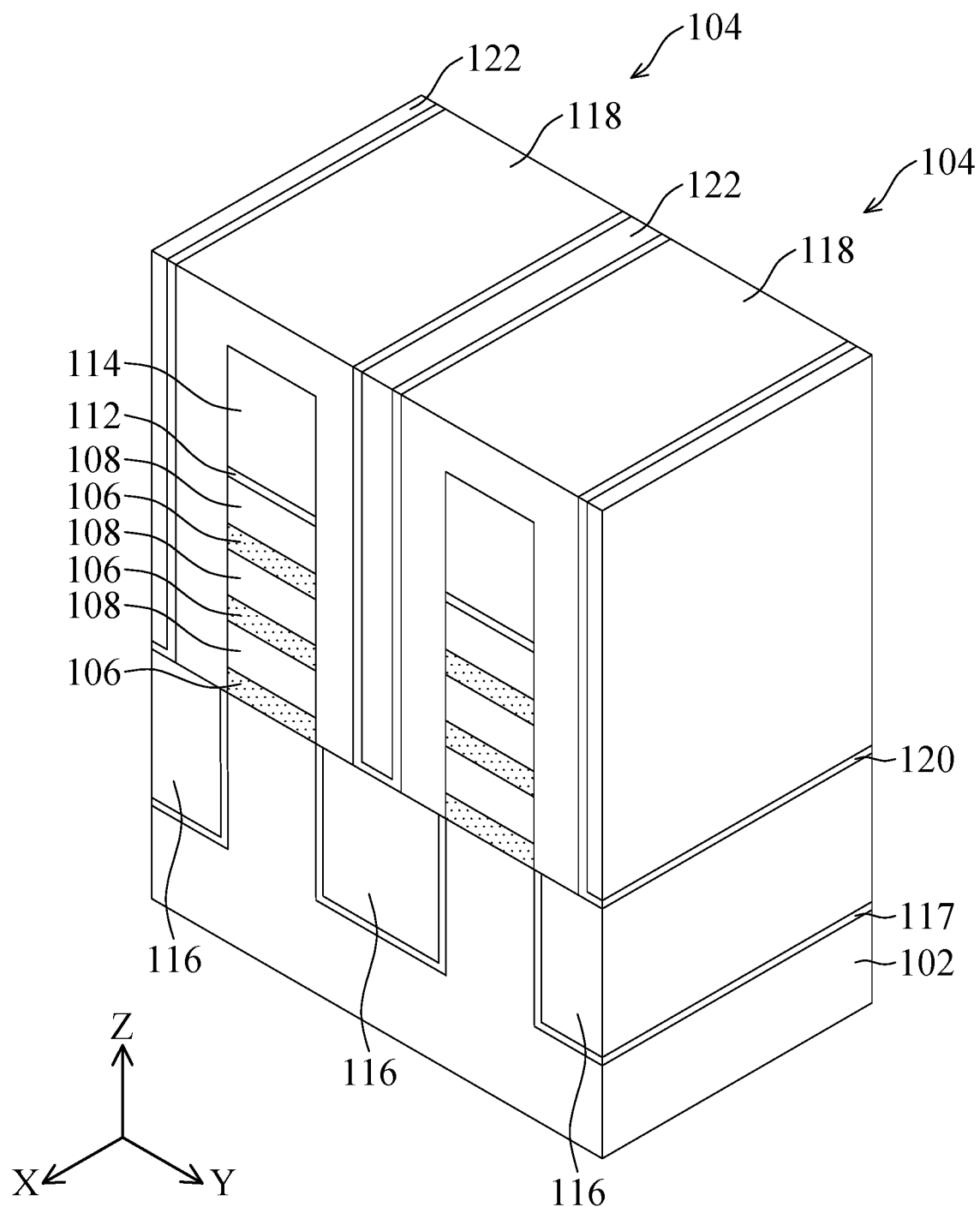
Figure 2I:
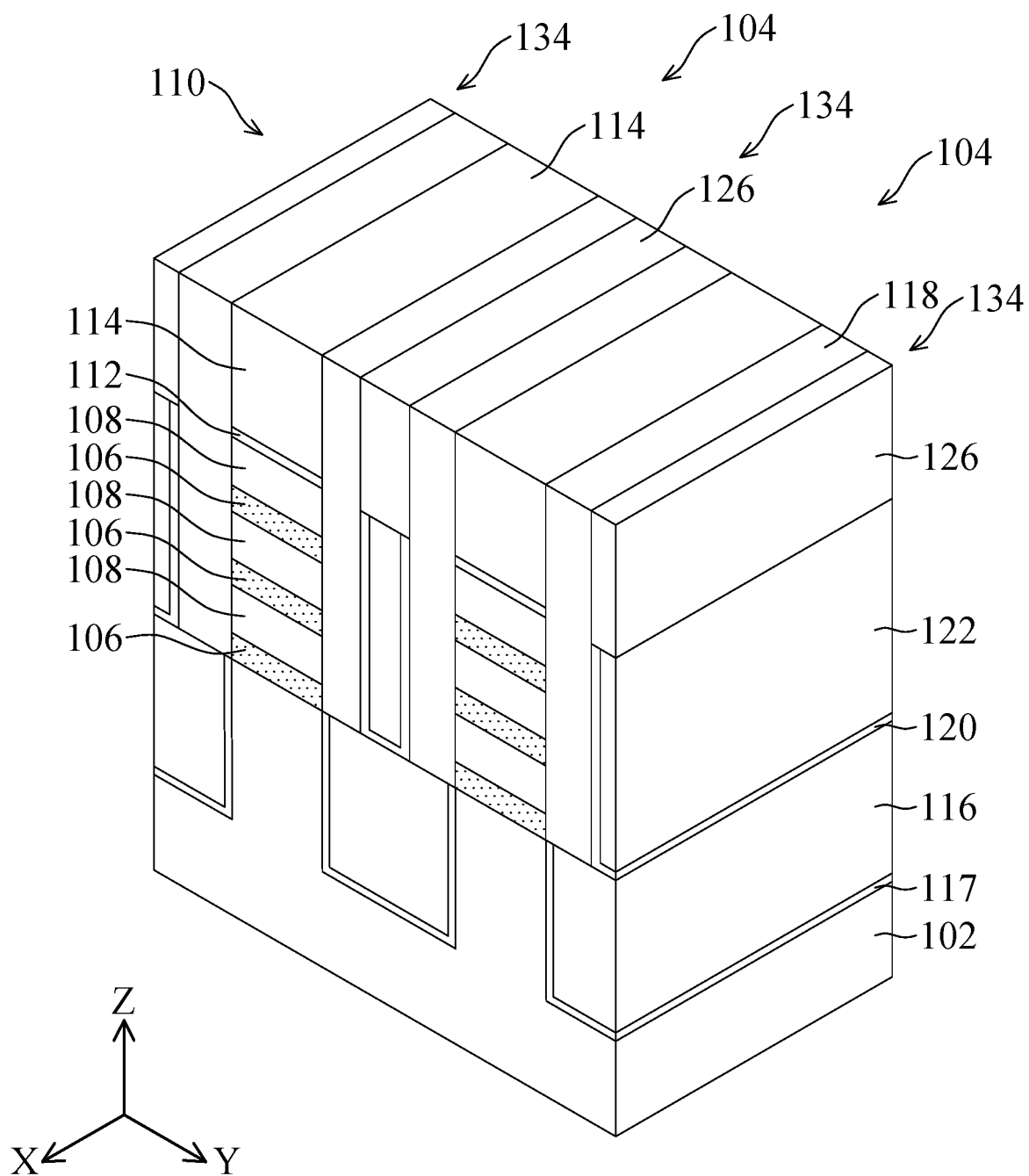
Figure 2J:
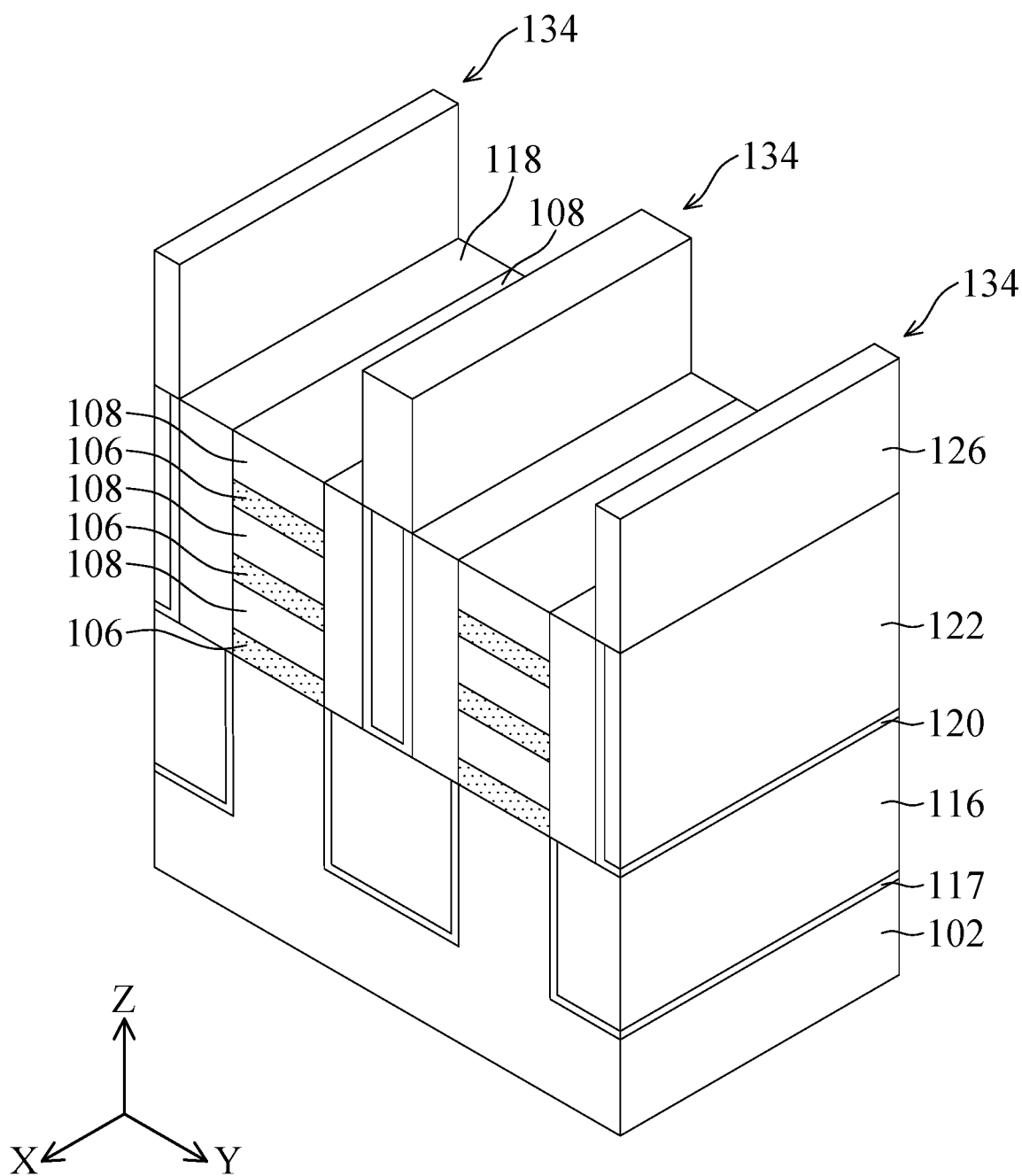
Figure 2K:
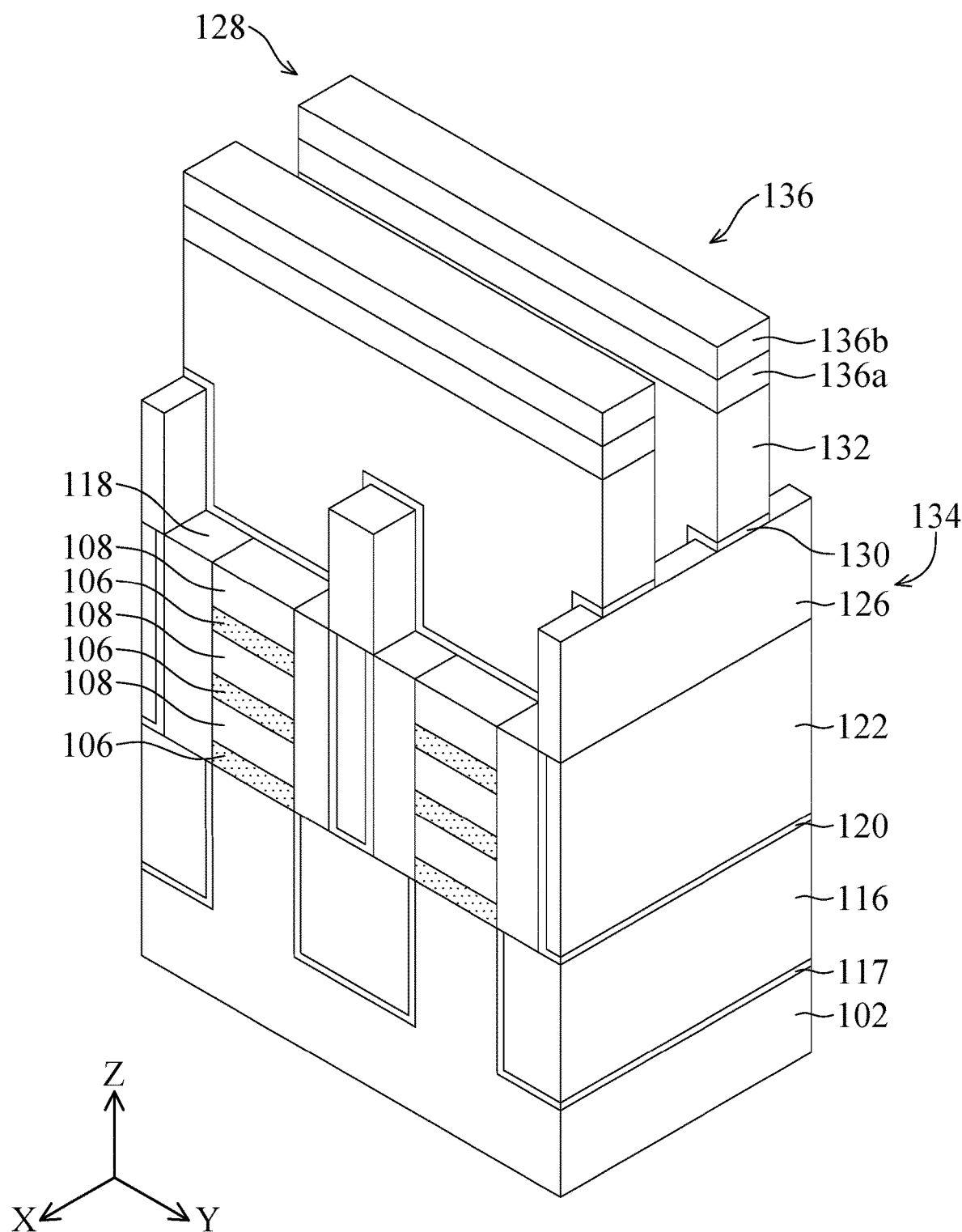
Figure 2L:
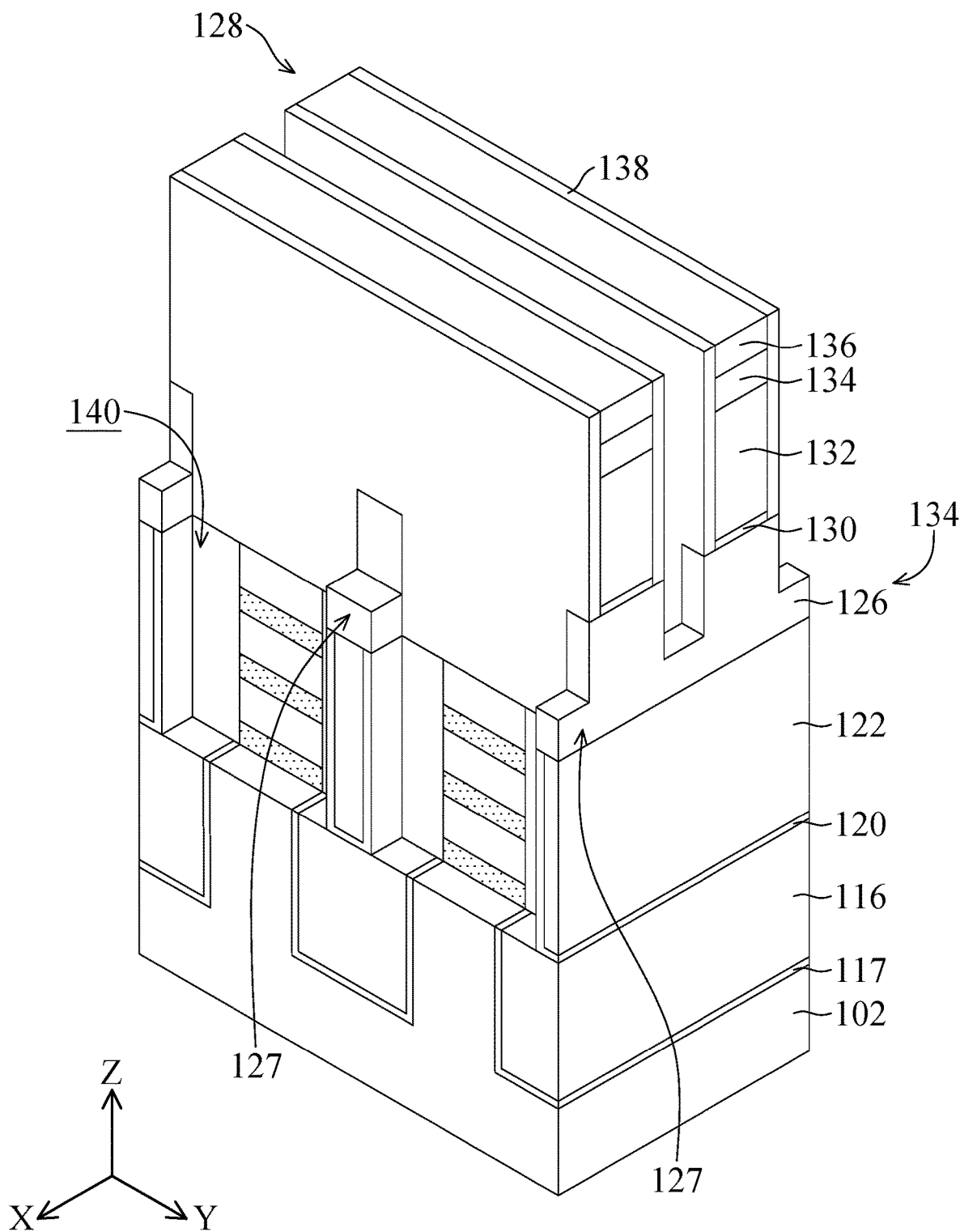
Figure 2M:
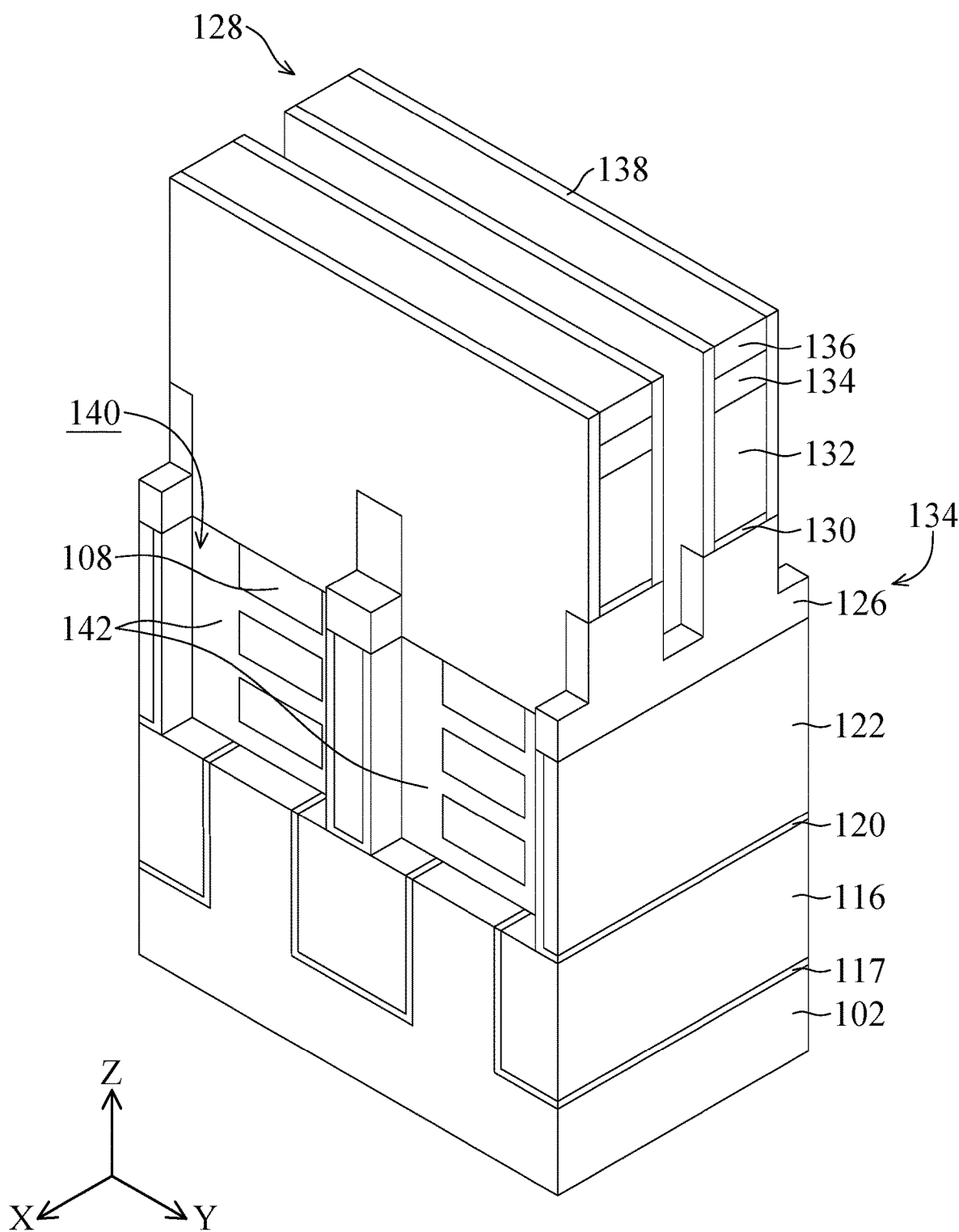
Figure 2N:
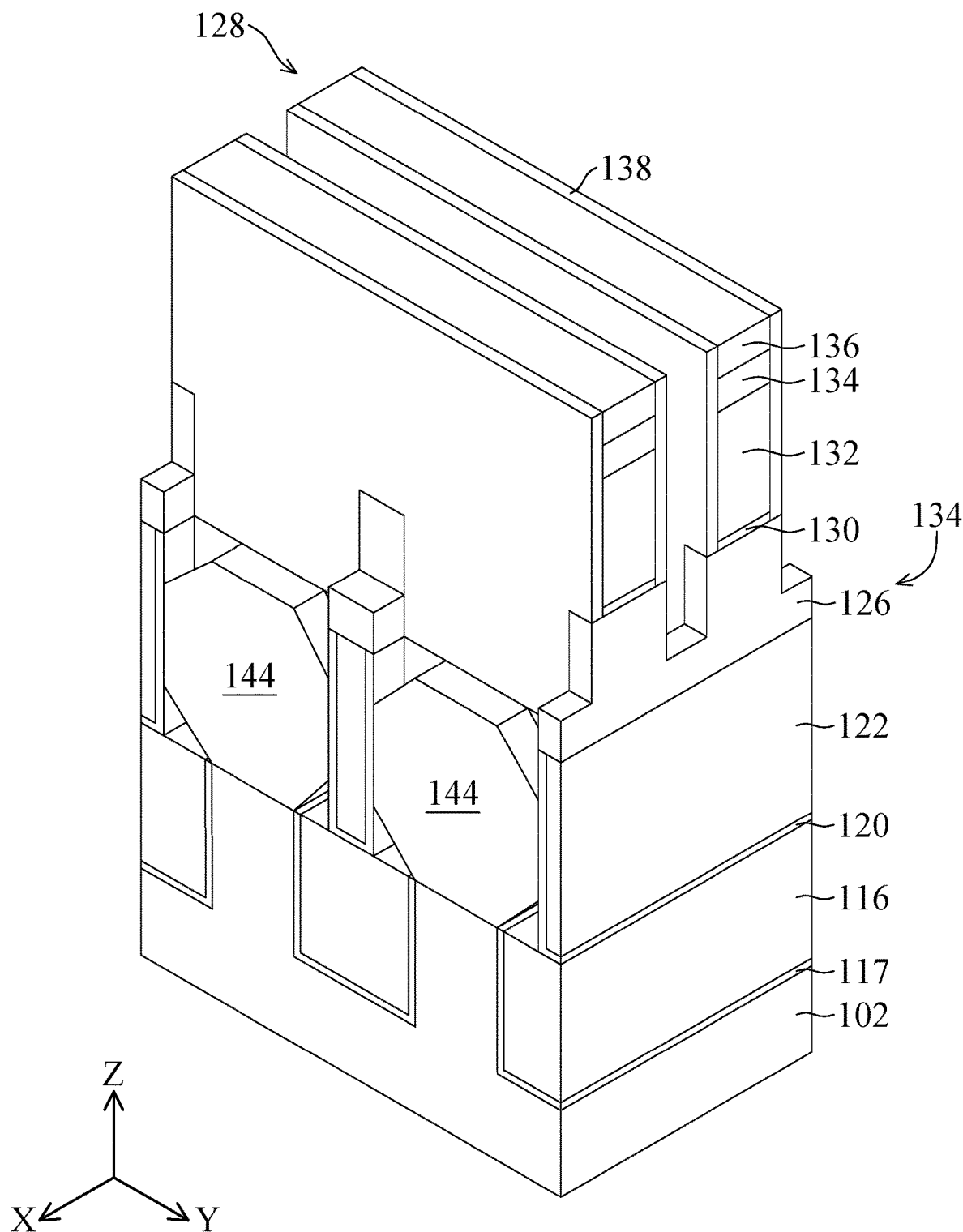
Figure 2O:
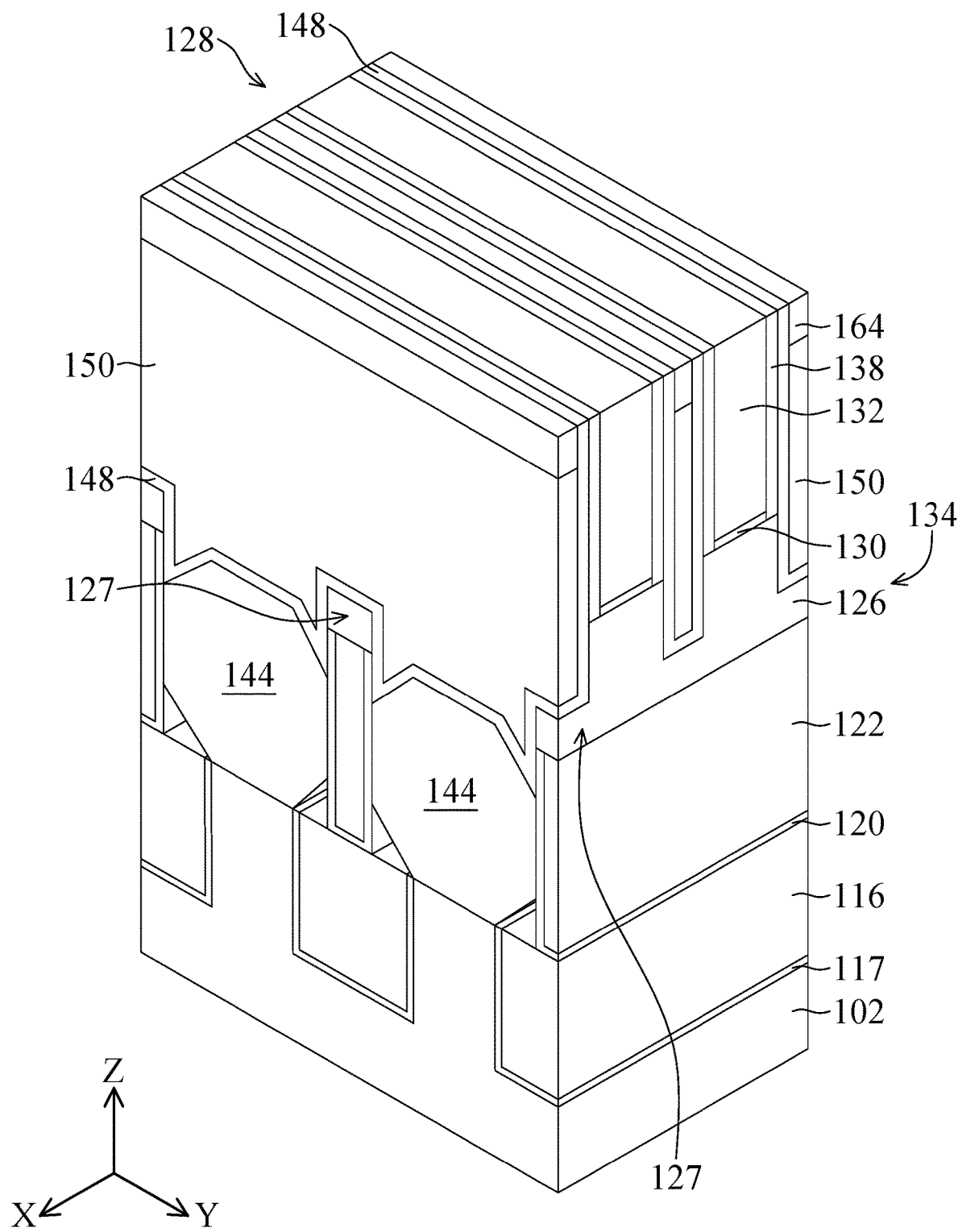
Figure 2P:
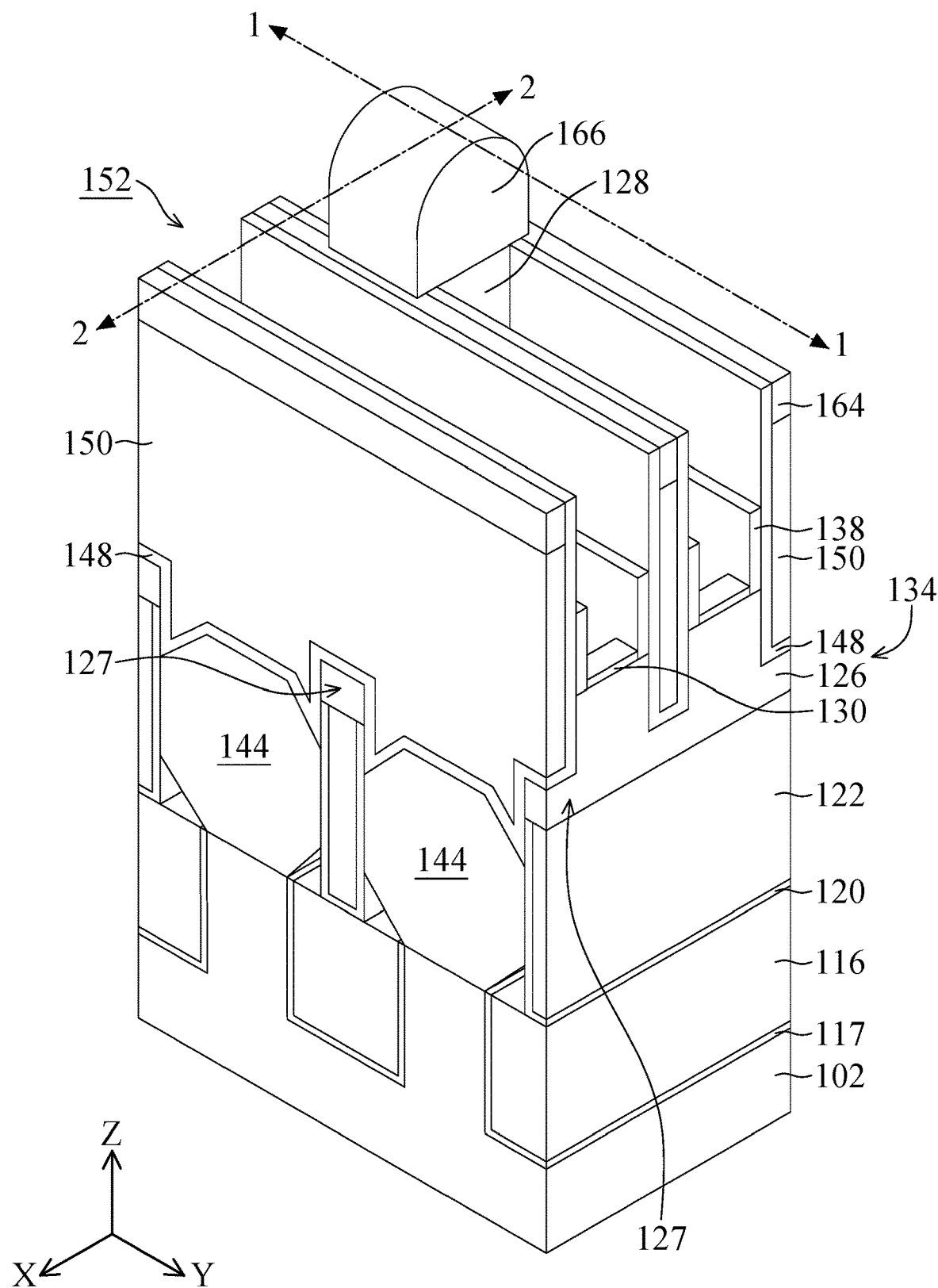
Figures 1, 2P:
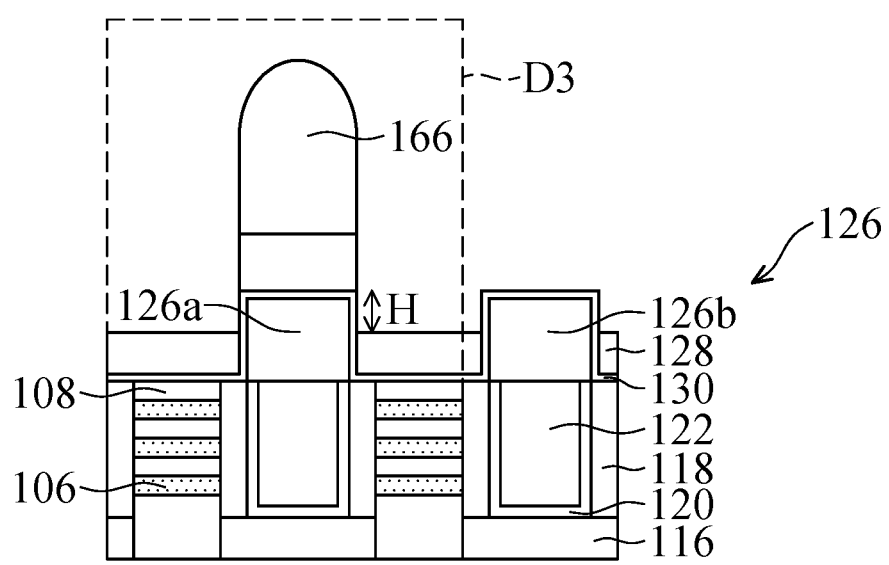
Figures 2, 2P:
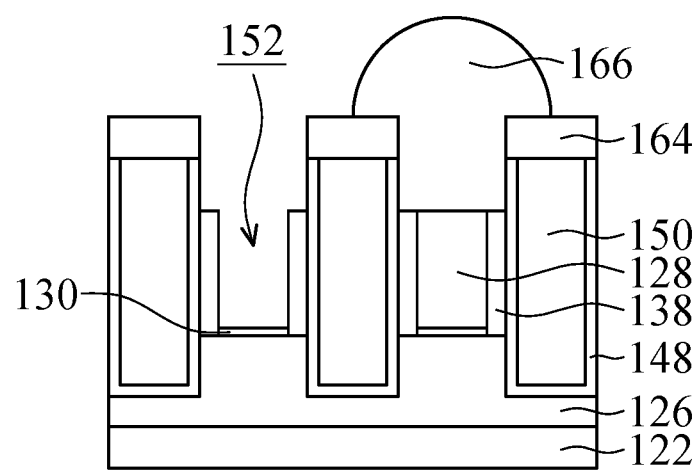
Figures 2, 2P, 3:
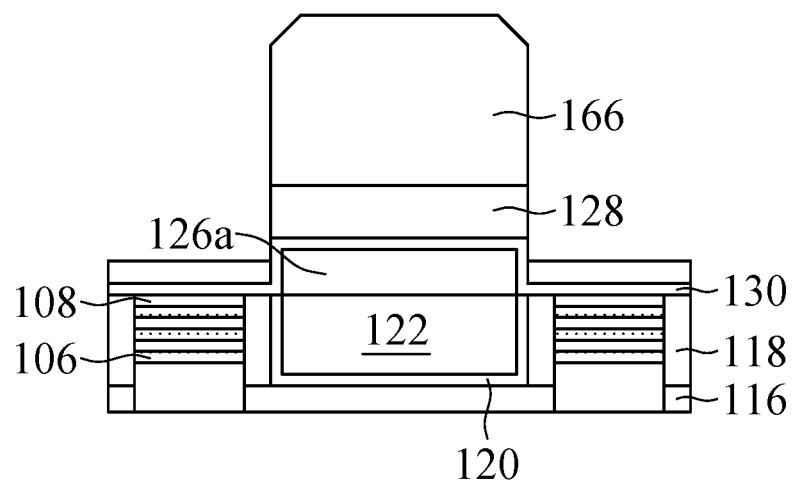
Figures 2, 2P, 3, 4:
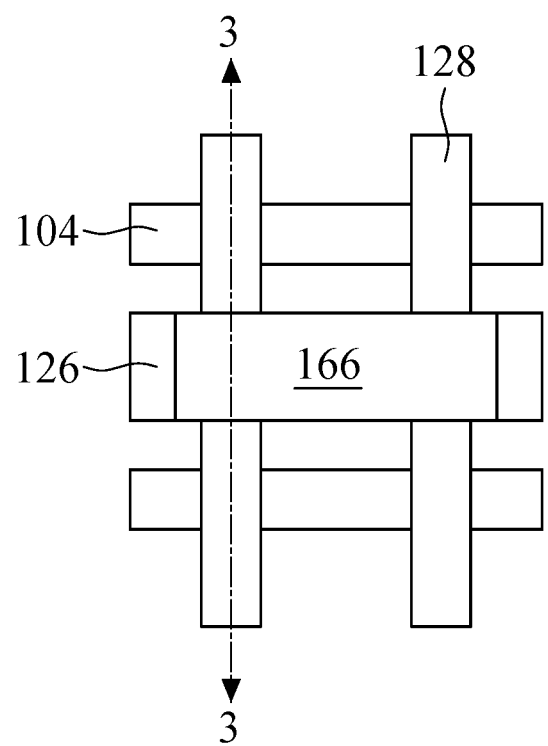
Figure 2Q:
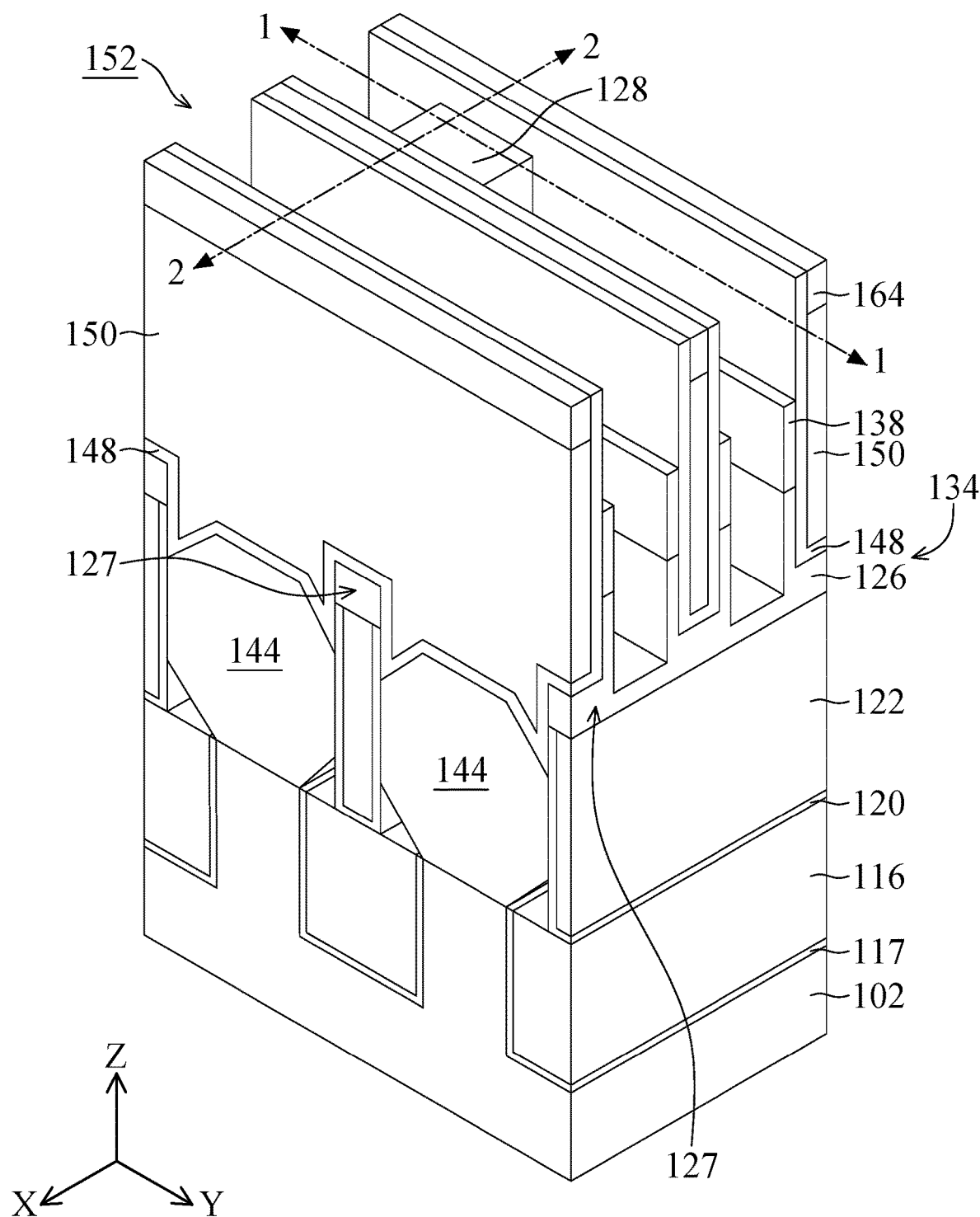
Figures 1, 2Q:
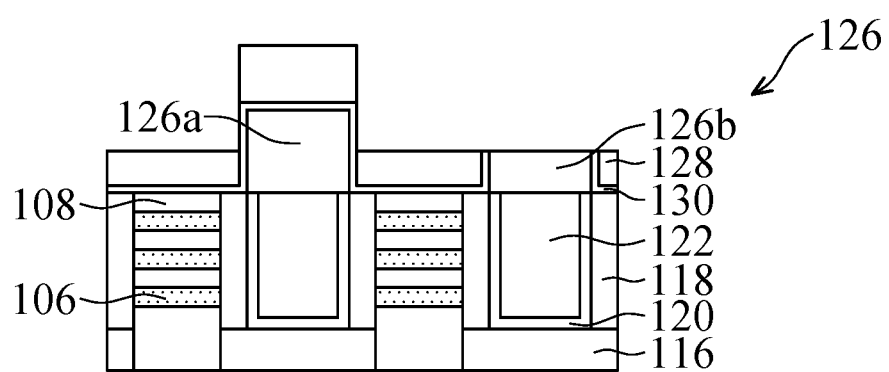
Figures 2, 2Q:
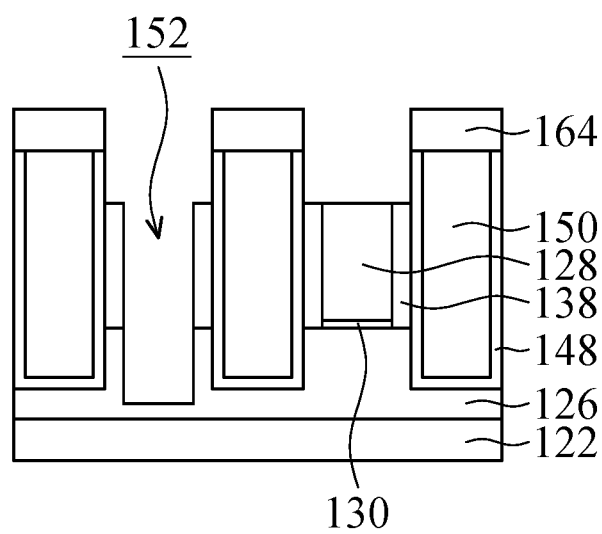
Figure 2R:
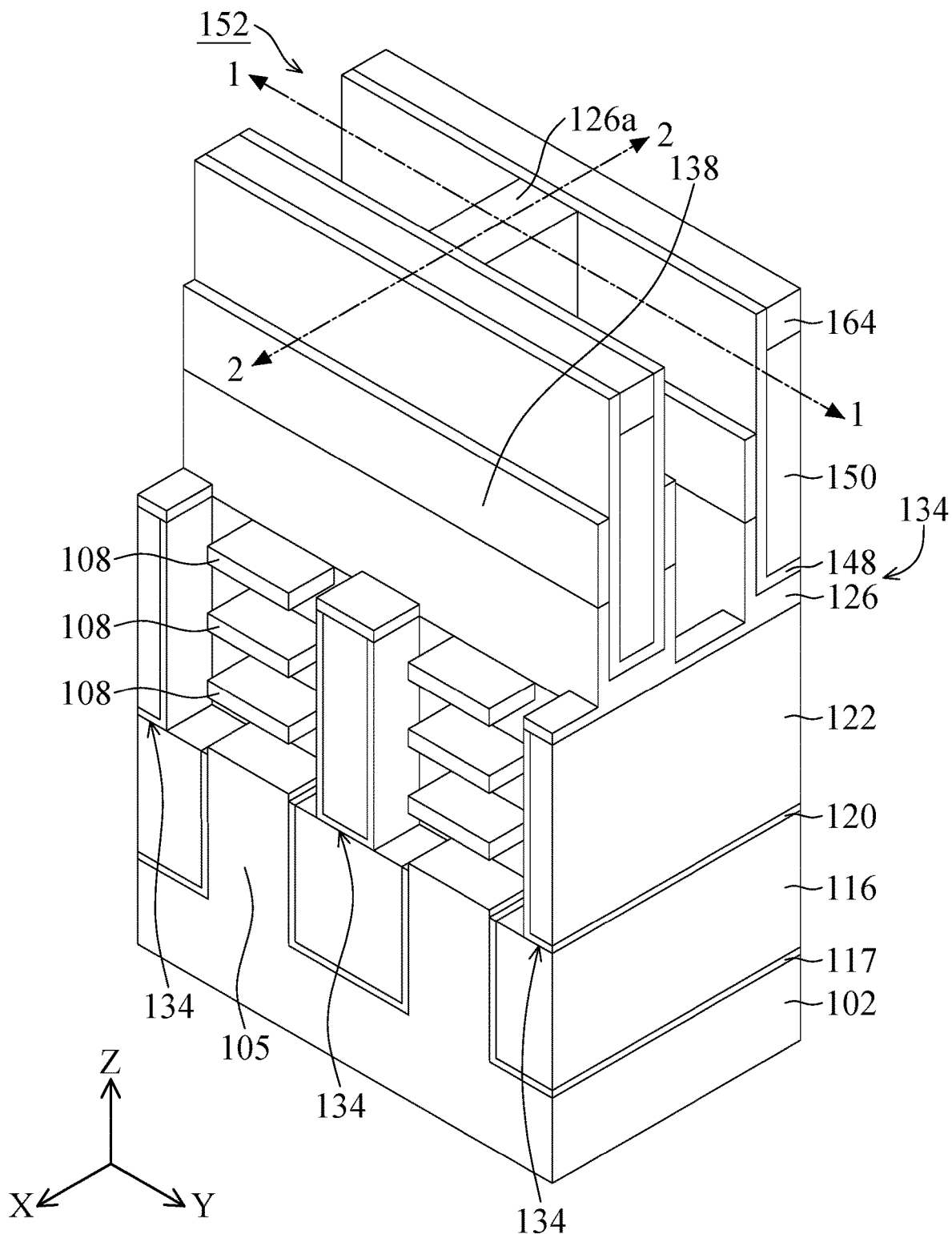
Figures 1, 2R:
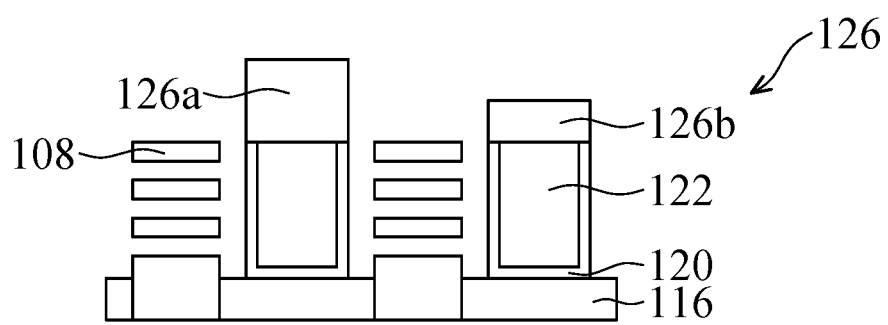
Figures 2, 2R:
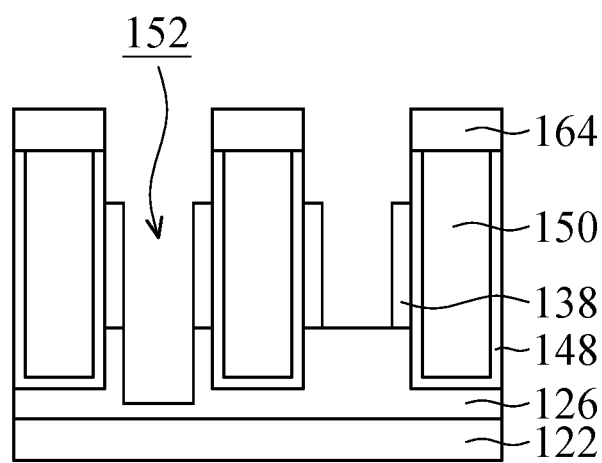
Figure 2S:
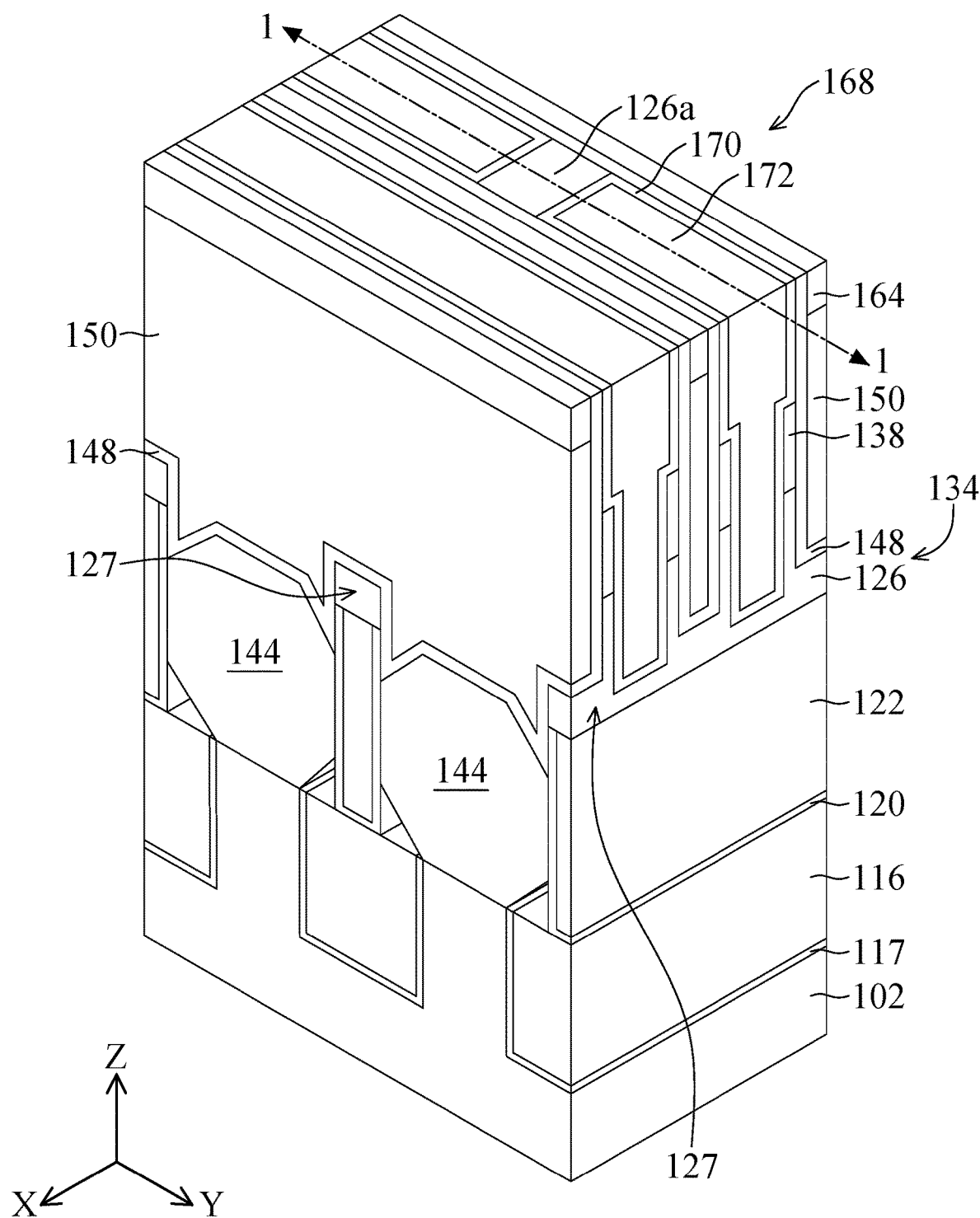
Figure 2T:
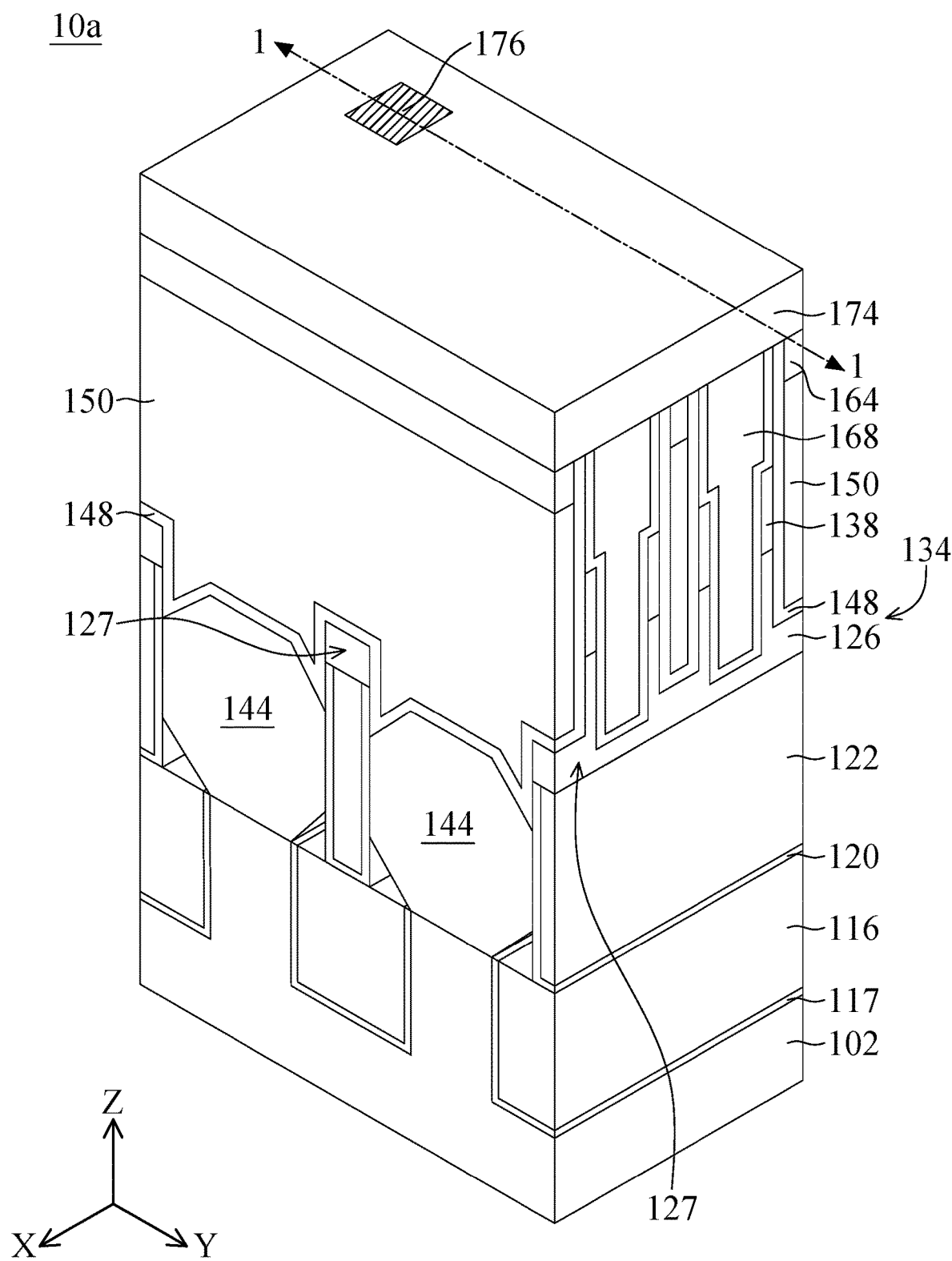
Figures 1, 2T:
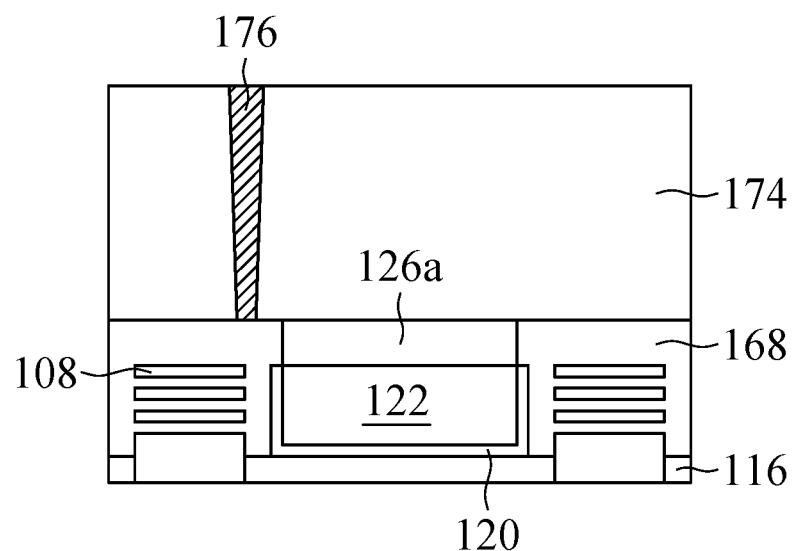

FIGS. 2A-2T are perspective representations of various stages of forming a semiconductor device structure 10a, in accordance with some embodiments of the disclosure. More specifically, FIGS. 2A-2Q, 2S-2T illustrate perspective views of intermediate stages of manufacturing the semiconductor structure 10a shown in the dotted line block $C_1$ of FIG. 1, and FIG. 2R illustrates diagrammatic perspective view of intermediate stages of manufacturing the semiconductor structure 10a shown in the dotted line block $C_2$ of FIG. 1 in accordance with some embodiments.

The semiconductor device structure 10a may be a gate all around (GAA) transistor structure. FIGS. 2P-1, 2Q-1, 2R-1, 2T-1 are cross-sectional representations of various stages of forming a semiconductor device structure 10a, in accordance with some embodiments of the disclosure. FIGS. 2P-1, 2Q-1, 2R-1, 2T-1 show cross-sectional representations taken along line 1-1 from the top of the semiconductor device structure 10a to the middle of the isolation structure 116 in FIGS. 2P, 2Q, 2R, 2T, respectively. FIGS. 2P-2, 2Q-2, 2R-2 are cross-sectional representations of various stages of forming a semiconductor device structure 10a, in accordance with some embodiments of the disclosure. FIGS. 2P-2, 2Q-2, 2R-2 show cross-sectional representations taken along line 2-2 from the top of the semiconductor device structure 10a to the middle of the fin isolation structure 122 in FIGS. 2P, 2Q, 2R, respectively A semiconductor stack including first semiconductor material layers 106 and second semiconductor material layers 108 are formed over a substrate 102, as shown in FIG. 2A in accordance with some embodiments. The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may be an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, first semiconductor material layers 106 and second semiconductor material layers 108 are alternating stacked over the substrate 102 to form the semiconductor stack, as shown in FIG. 2A in accordance with some embodiments. The first semiconductor material layers 106 and the second semiconductor material layers 108 may include Si, Ge, SiGe, GaAs, InSb, GaP, GaSb, InAlAs, InGaAs, GaSbP, GaAsSb, or InP. The first semiconductor material layers 106 and second semiconductor material layers 108 may be made of different materials with different etching rates. In some embodiments, for example, the first semiconductor material layers 106 are made of SiGe and the second semiconductor material layers 108 are made of Si.

The first semiconductor material layers 106 and second semiconductor material layers 108 may be formed by low pressure chemical vapor deposition (LPCVD) process, epitaxial growth process, other applicable methods, or a combination thereof. The epitaxial growth process may include molecular beam epitaxy (MBE), metal organic chemical vapor deposition (MOCVD), or vapor phase epitaxy (VPE).

It should be noted that, although there are three layers of the first semiconductor material layers 106 and three layers of the second semiconductor material layers 108 shown in FIG. 2A, the number of the first semiconductor material layers 106 and second semiconductor material layers 108 are not limited herein, depending on the demand of performance and process. For example, the semiconductor structure may include two to five layers of the first semiconductor material layers 106 and two to five layers of the second semiconductor material layers 108.

After the first semiconductor material layers 106 and the second semiconductor material layers 108 are formed as the semiconductor material stack over the substrate 102, the semiconductor material stack is patterned to form fin structures 104 using the patterned mask structure 110 as a mask layer, as shown in FIG. 2B in accordance with some embodiments. In some embodiments, the fin structures 104 include base fin structures 105 and the semiconductor material stacks, including the first semiconductor material layers 106 and the second semiconductor material layers 108, formed over the base fin structure 105.

The patterning process may including forming a mask structure 110 over the first semiconductor material layers 106 and the second semiconductor material layers 108 and etching the semiconductor material stack and the underlying substrate 102 through the mask structure 110, as shown in FIG. 2B in accordance with some embodiments. The mask structure 110 may be a multilayer structure including a pad layer 112 and a hard mask layer 114 formed over the pad layer 112. The pad layer 112 may be made of silicon oxide, which may be formed by thermal oxidation or CVD. The hard mask layer 114 may be made of silicon nitride, which may be formed by CVD, such as LPCVD or plasma-enhanced CVD (PECVD).

The patterning process of forming the fin structures 104 may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

After the fin structures 104 are formed, a liner layer 117 is formed over the fin structures 104 and in the trenches between the fin structures 104, as shown in FIG. 2C in accordance with some embodiments. The liner layer 117 may be conformally formed over the substrate 102, the fin structure 104, and the mask structure 110 covering the fin structure 104. The liner layer 117 may be used to protect the fin structure 104 from being damaged in the following processes (such as an anneal process or an etching process). The liner layer 117 may be made of silicon nitride. The liner layer 117 may be formed by using a thermal oxidation, a CVD process, an atomic layer deposition (ALD) process, a LPCVD process, a plasma enhanced CVD (PECVD) process, a HDPCVD process, a flowable CVD (FCVD) process, another applicable process, or a combination thereof.

Next, an isolation structure material 119 is be then filled over the liner layer 117 in the trenches between the fin structures 104, as shown in FIG. 2D in accordance with some embodiments. The isolation structure material 119 may be made of silicon oxide, silicon nitride, silicon oxynitride (SiON), fluoride-doped silicate glass (FSG), other low-k dielectric materials, or a combination thereof. The isolation structure material 119 may be deposited by a deposition process, such as a chemical vapor deposition (CVD) process (e.g. a flowable CVD (FCVD) process), a spin-on-glass process, or another applicable process.

Next, the isolation structure material 119 and the liner layer 117 are etched back by an etching process, and an isolation structure 116 is formed surrounding the base fin structure 105, as shown in FIG. 2E in accordance with some embodiments. The etching process may be used to remove the top portion of the liner layer 117 and the top portion of the isolation structure material 119. As a result, the first semiconductor material layers 106 and the second semiconductor material layers 108 may be exposed. The isolation structure 116 may be a shallow trench isolation (STI) structure. The isolation structure 116 may be configured to electrically isolate active regions such as fin structures 104 of the semiconductor structure 10a and prevent electrical interference or crosstalk.

Next, a semiconductor liner layer (not shown) may be formed over the fin structures 104. The semiconductor liner may be a Si layer and may be incorporated into the subsequently formed cladding layer during the epitaxial growth process for forming the cladding layer.

After the semiconductor liner layer is formed, a cladding layer 118 is formed over the top surfaces and the sidewalls of the fin structures 104 and over the isolation structure 116, as shown in FIG. 2F in accordance with some embodiments. The cladding layer 118 may be made of semiconductor materials such as silicon germanium (SiGe). The cladding layer 118 and the first semiconductor material layers 106 may be made of the same material.

The cladding layer 118 may be formed by performing an epitaxy process, such as VPE and/or UHV CVD, molecular beam epitaxy, other applicable epitaxial growth processes, or a combination thereof. After the cladding layer 118 is deposited, an etching process may be performed to remove a portion of the cladding layer 118 to expose the top surface of the isolation structure 116. The cladding layer 118 formed over the top surface of the isolation structure 116 is partially or completely removed by the etching process, such that the thickness of the cladding layer 118 over the top surface of the fin structures 104 is thinner than the thickness of the cladding layer 118 on the sidewalls of the fin structures 104. The etching process may include a plasma dry etching process.

Next, a dielectric liner 120 is formed over the cladding layers 118 and the isolation structure 116, as shown in FIG. 2G in accordance with some embodiments. The dielectric liner 120 may be made of a low k dielectric material having a k value lower than 7. The dielectric liner 120 may be made of oxide, nitride, SiN, SiCN, SiOCN, SiON, or the like. The dielectric liner 120 may be deposited using CVD, PVD, ALD, HDPCVD, MOCVD, RPCVD, PECVD, LPCVD, ALCVD, APCVD, other applicable methods, or a combination thereof.

Next, a fin isolation material 122 is formed to completely fill the spaces between the adjacent fin structures 104, and a planarization process is performed until the top surfaces of the cladding layers 118 are exposed, as shown in FIG. 2H in accordance with some embodiments. The fin isolation material 122 may be made of a low k dielectric material such as oxide, nitride, SiN, SiCN, SiOCN, SiON, or the like. The fin isolation material 122 and the dielectric liner 120 may be made of different dielectric materials. The fin isolation material 122 and the dielectric liner 120 may both be made of oxide formed by different methods. The fin isolation material 122 may be deposited using a flowable CVD (FCVD) process that includes, for example, depositing a flowable material (such as a liquid compound) and converting the flowable material to a solid material by a suitable technique, such as thermal annealing and/or ultraviolet radiation treating. The planarizing process may include a grinding process, a chemical mechanical polishing (CMP) process, an etching process, other applicable processes, or a combination thereof.

Next, the top portion of the fin isolation material 122 and the dielectric liner 120 are recessed to form a fin isolation structure 122, and a capping layer 126 is formed in the recesses to form a dielectric structure 134 separating the fin structures 104, as shown in FIG. 2I in accordance with some embodiments. In some embodiments, the dielectric structure 134 includes the fin isolation structure 122 and the capping layer 126 formed over the fin isolation structure 122. The fin isolation material 122 may be recessed by an etching process. The etching process may include a dry etching process or a wet etching process.

The capping layer 126 may be made of high-k dielectric material such as metal oxides, metal nitrides, metal silicates, transition metal-oxides, transition metal-nitrides, transition metal-silicates, oxynitrides of metals, other suitable materials, or a combination thereof. Examples of the high-k dielectric material include, but are not limited to, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

In some embodiments, the dielectric constant of the capping layer 126 is higher than that of the fin isolation structure 122. The capping layer 126 may be formed by performing ALD, CVD, PVD, oxidation-based deposition process, other suitable process, or a combination thereof. After the capping layer 126 is formed, a planarization process may be performed until the hard mask layer 114 of the mask structure 110 is exposed.

In some embodiments, the interface between the capping layer 126 and the fin isolation structure 122 is substantially level with the top surface of the topmost second semiconductor material layers 108.

Next, the mask structure 110 including the pad layer 112 and the hard mask layer 114 is removed, and the upper portions of the cladding layer 118 are partially removed to expose the top surfaces of the topmost second semiconductor material layers 108, as shown in FIG. 2J in accordance with some embodiments. More specifically, the upper portions of the cladding layer 118 are removed first, and the mask structure 110 is removed afterwards in accordance with some embodiments. The top surfaces of the cladding layers 118 are substantially level with the top surfaces of the topmost second semiconductor material layers 108. The mask structures 107 and the cladding layers 118 may be recessed by performing an etching process. The etching processes may be dry etching, wet drying, reactive ion etching, or other applicable etching methods.

Next, a dummy gate structure 128 is formed over and across the fin structures 104, the cladding layer 118, and the dielectric structure 134, as shown in FIG. 2K in accordance with some embodiments. The dummy gate structures 128 may be used to define the source/drain regions and the channel regions of the resulting semiconductor structure 10a. The dummy gate structure 128 may include a dummy gate dielectric layer 130 and a dummy gate electrode layer 132. The dummy gate dielectric layer 130 and the dummy gate electrode layer 132 may be replaced by the following steps to form a real gate structure with a high-k dielectric layer and a metal gate electrode layer.

The dummy gate dielectric layer 130 may include one or more dielectric materials, such as silicon oxide, silicon nitride, silicon oxynitride (SiON), HfO$_2$, HfZrO, HfSiO, HfTiO, HfAlO, or a combination thereof. The dummy gate dielectric layer 130 may be formed by an oxidation process (e.g., a dry oxidation process, or a wet oxidation process), a chemical vapor deposition process, other applicable processes, or a combination thereof. Alternatively, the dummy gate dielectric layer 130 may include a high-k dielectric layer (e.g., the dielectric constant is greater than 3.9) such as hafnium oxide (HfO$_2$). Alternatively, the high-k dielectric layer may include other high-k dielectrics, such as LaO, AlO, ZrO, TiO, Ta$_2$O$_5$, Y$_2$O$_3$, SrTiO$_3$, BaTiO$_3$, BaZrO, HfZrO, HfLaO, HfTaO, HfSiO, HfSiON, HfTiO, LaSiO, AlSiO, (Ba, Sr)TiO$_3$, Al$_2$O$_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer 132 may include polycrystalline-silicon (poly-Si), poly-crystalline silicon-germanium (poly-SiGe), other applicable materials, or a combination thereof. The dummy gate electrode layer 132 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Hard mask layers 136 are formed over the dummy gate structures 128, as shown in FIG. 2K in accordance with some embodiments. The hard mask layers 136 may include multiple layers, such as an oxide layer 136a and a nitride layer 136b. In some embodiments, the oxide layer 136a is silicon oxide, and the nitride layer 136b is silicon nitride.

The formation of the dummy gate structures 128 may include conformally forming a dielectric material as the dummy gate dielectric layers 130. Afterwards, a conductive material may be formed over the dielectric material as the dummy gate electrode layers 132. Moreover, bi-layered hard mask layers 136, including the oxide layer 136a and the nitride layer 136b, may be formed over the conductive material. Next, the dielectric material and the conductive material may be patterned and etched through the bi-layered hard mask layers 136 to form the dummy gate structures 128, as shown in FIG. 2K in accordance with some embodiments. The dummy gate dielectric layer 130 and the dummy gate electrode layer 132 may be etched by a dry etching process. After the etching process, the first semiconductor material layers 106 and the second semiconductor material layers 108 may be exposed on opposite sides of the dummy gate structure 128.

Next, a conformal dielectric layer is formed over the substrate 102 and the dummy gate structure 128, and then an etching process is performed. A pair of spacer layers 138 is formed over opposite sidewalls of the dummy gate structure 128, and a source/drain opening is formed beside dummy gate structure 128, as shown in FIG. 2L in accordance with some embodiments.

The spacer layers 138 may be a single layer or a multilayer structure. The spacer layers 138 are conformally formed over sidewalls of the dummy gate structure 128 and the capping layer 126.

The spacer layers 138 may be made of silicon oxide, silicon nitride, silicon oxynitride, and/or dielectric materials. In some embodiments, the spacer layers 138 are made of silicon nitride. The spacer layers 138 may be formed by a chemical vapor deposition (CVD) process, a spin-on-glass process, or another applicable process.

After the spacer layers 138 are formed, the first semiconductor material layers 106 and the second semiconductor material layers 108 of the fin structure 104 and the cladding layer 118 not covered by the dummy gate structures 128 and the spacer layers 138 are etched to form the trenches 140, as shown in FIG. 2L in accordance with some embodiments.

The fin structures 104 and the cladding layer 118 may be recessed by performing a number of etching processes. That is, the first semiconductor material layers 106 and the second semiconductor material layers 108 of the fin structures 104 and the cladding layer 118 may be etched in different etching processes. In addition, the capping layer 126 not covered by the dummy gate structures 128 and the spacer layers 138 are also partially etched to form recessed portions 127 during the etching processes in accordance with some embodiments. That is, the capping layer 126 is thicker under the dummy gate structure 128 and the spacer layers 138, as shown in FIG. 2L in accordance with some embodiments. The etching process may be a dry etching process or a wet etching process. In some embodiments, the fin structures 104 and the cladding layer 118 are etched by a dry etching process.

Next, the first semiconductor material layers 106 are laterally etched from the source/drain opening to form recesses (not shown). The outer portions of the first semiconductor material layers 106 may be removed, and the inner portions of the first semiconductor material layers 106 under the dummy gate structures 128 and the spacer layers 138 may remain. After the lateral etching process, the sidewalls of the etched first semiconductor material layers 106 may be not aligned with the sidewalls of the second semiconductor material layers 108. The cladding layer 118 may be exposed in the recess.

The lateral etching of the first semiconductor material layers 106 may be a dry etching process, a wet etching process, or a combination thereof. In some embodiments, the first semiconductor material layers 106 are Ge or SiGe and the second semiconductor material layers 108 are Si, and the first semiconductor material layers 106 are selectively etched to form the recesses by using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions, or the like.

Next, an inner spacer 142 is formed in the recess, as shown in FIG. 2M in accordance with some embodiments. The inner spacer 142 may provide a barrier between subsequently formed source/drain epitaxial structures and gate structure. The inner spacer 142 may be made of dielectric material such as silicon oxide (SiO$_2$), silicon nitride (SiN), silicon carbide (SiC), silicon oxynitride (SiON), silicon carbon nitride (SiCN), silicon oxide carbonitride (SiOCN), or a combination thereof. The inner spacer 142 may be formed by a deposition process. The deposition process may include a CVD process (such as LPCVD, PECVD, SACVD, or FCVD), an ALD process, another applicable method, or a combination thereof.

Next, a source/drain epitaxial structure 144 is formed in the source/drain opening, as shown in FIG. 2N in accordance with some embodiments. The source/drain epitaxial structure 144 may be formed over opposite sides of the dummy gate structure 128.

A strained material may be grown in the source/drain opening by an epitaxial (epi) process to form the source/drain epitaxial structure 144. In addition, the lattice constant of the strained material may be different from the lattice constant of the substrate 102. The source/drain epitaxial structure 144 may include Ge, SiGe, InAs, InGaAs, InSb, GaAs, GaSb, InAlP, InP, SiC, SiP, other applicable materials, or a combination thereof. The source/drain epitaxial structure 144 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

In some embodiments, the source/drain epitaxial structures 144 are in-situ doped during the epitaxial growth process. For example, the source/drain epitaxial structures 144 may be the epitaxially grown SiGe doped with boron (B). For example, the source/drain epitaxial structures 144 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. The source/drain epitaxial structures 144 may be doped in one or more implantation processes after the epitaxial growth process.

Next, a contact etch stop layer 148 is formed over the source/drain epitaxial structure 144, as shown in FIG. 2O in accordance with some embodiments. More specifically, the contact etch stop layers 148 cover the sidewalls of the spacer layers 138, the top surfaces and sidewalls of the recessed portion 127 of the capping layer 126, and the source/drain structures 144 in accordance with some embodiments.

The contact etch stop layer 148 may be made of a dielectric material such as silicon nitride, silicon oxide, silicon oxynitride (SiON), other applicable materials, or a combination thereof. The contact etch stop layer 148 may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

After the contact etch stop layer 148 is formed, an inter-layer dielectric (ILD) structure 150 is formed over the contact etch stop layer 148, as shown in FIG. 2O in accordance with some embodiments. The ILD structure 150 may include multilayers made of multiple dielectric materials, such as silicon oxide (SiO$_x$, where x may be a positive integer), silicon oxycarbide (SiCO$_y$, where y may be a positive integer), silicon oxycarbonitride (SiNCO$_z$, where z may be a positive integer), silicon nitride, silicon oxynitride, phosphosilicate glass (PSG), borophosphosilicate glass (BPSG), low-k dielectric material, or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 150 may be formed by chemical vapor deposition (CVD), physical vapor deposition, (PVD), atomic layer deposition (ALD), spin-on coating, or other applicable processes.

Afterwards, a planarizing process or an etch-back process is performed on the ILD structure 150 until the top surface of the dummy gate structure 128 is exposed, as shown in FIG. 2O in accordance with some embodiments. After the planarizing process, the top surface of the dummy gate structure 128 may be substantially level with the top surfaces of the spacer layers 138 and the ILD structure 150. The planarizing process may include a grinding process, a chemical mechanical polishing (CMP) process, an etching process, other applicable processes, or a combination thereof.

Afterwards, a protection layer 164 is formed over the interlayer dielectric layer 150, as shown in FIG. 2O in accordance with some embodiments. More specifically, after the planarization process is performed, the ILD structure 150 is recessed and the protection layer 164 is deposited over the ILD structure 150 to protect the ILD structure 150 from subsequent etching processes. The protection layer 164 may be made of a material that is the same as or similar to that in the contact etch stop layer 148. The protection layer 164 may be made of Si$_3$N$_4$, SiCN, SiOCN, SiOC, a metal oxide such as HrO$_2$, ZrO$_2$, hafnium aluminum oxide, and hafnium silicate, or other applicable material. The protection layer 164 may be formed by CVD, PVD, ALD, or other applicable methods.

Next, the dummy gate structure 128 is patterned by a photoresist layer 166, as shown in FIGS. 2P, 2P-1, 2P-2 in accordance with some embodiments. The top portion of the spacer layers 138 not covered by the photoresist layer 166 may be also removed. The photoresist layer 166 may cover the capping layer 126a and expose the capping layer 126b. In some embodiments, the top portion of the capping layer 126b that is not covered by the photoresist layer 166 is exposed, and the bottom portion of the capping layer 126b is surrounded by the dummy gate structure 128 after the dummy gate structure 128 is patterned. In addition, a trench 152 is formed between the spacer layers 138 over the fin structure 104.

In some embodiments, the thickness H of the exposed portion of the capping layer 126b is in a range of about 5 nm to about 7 nm. If the exposed portion of the capping layer 126b is too thick, the dummy gate structure 128 remained between the capping layers 126a and 126b may be too thin, and the capping layers 126 may be damaged during the subsequently etching processes. If the exposed portion of the capping layer 126b is too thin, the dummy gate structure 128 remained between the capping layers 126a and 126b may be too much and hardly to be removed in the following processes.

The bottom portion of the spacer layers 138 may remain after the dummy gate structure 128 is patterned. The top surfaces of the bottom portion of the spacer layers 138 may be exposed in the trench 152. The bottom of the trench 152 may be narrower than the top of the trench 152.

FIG. 2P-3 is an enlarged cross sectional view of the dashed box shown in FIG. 2P-1. FIG. 2P-4 is a top view of the semiconductor device structure shown in FIG. 2P-3. FIG. 2P-3 shows a cross-sectional representation taken along line 3-3 in FIGS. 2P-4.

In some embodiments as shown in FIGS. 2P-3 and 2P-4, the width of the photoresist layer 166 is substantially equal to the width of the capping layer 126. In some embodiments, the sidewalls of the dummy gate structure 128 are vertically aligned with sidewalls of the capping layer 126a. In some embodiments, the width of the dummy gate structure 128 over the capping layer 126a is substantially equal to the width of the capping layer 126a. In some embodiments, the dummy gate structure 128 covers the top surface of the capping layer 126a. The capping layer 126a may be fully protected by the dummy gate structure 128.

The dummy gate structure 128 and the top portion of the spacer layers 138 may be removed by a dry etching process or a wet etching process. The removal process may include one or more etching processes. For example, when the dummy gate electrode layers 132 are polysilicon, a wet etchant such as a tetramethylammonium hydroxide (TMAH) solution may be used to selectively remove the dummy gate electrode layers 132.

Next, the capping layer 126 is patterned by using the dummy gate structure 128 as a mask layer. The photoresist layer 166 is removed, and the top portion of the capping layer 126b and the dummy gate structure 128 may be further removed during patterning the capping layer 126, as shown in FIGS. 2Q, 2Q-1, 2Q-2 in accordance with some embodiments. The dummy gate structure 128 may be etched to expose the capping layer 126b, and the capping layer 126b may be removed later.

In some embodiments, the bottom portion of the capping layer 126b remains after the dummy gate structure 128 is patterned. In some embodiments, the dummy gate structure 128 remains over the second semiconductor material layers 108 of the fin structures 104 after the dummy gate structure 128 is patterned. The capping layer 126b and the dummy gate structure 128 may be removed by a dry etching process or a wet etching process.

Next, the dummy gate structure 128 is completely removed from the top surfaces of the fin structures 104 and the capping layer 126a, as shown in FIGS. 2R, 2R-1, 2R-2 in accordance with some embodiments. Afterwards, the dummy gate dielectric layers 130 may be removed using a plasma dry etching, a dry chemical etching, and/or a wet etching.

The remaining portions of the capping layer 126a and 126b may be configured to separate the gate structures formed afterwards into various portions and may therefore be left over the fin isolation structure 122. In some embodiments, the capping layer 126a is higher than the capping layer 126b.

After the dummy gate structure 128 is removed, the first semiconductor material layers 106 and the cladding layer 118 are removed, as shown in FIGS. 2R, 2R-1, 2R-2 in accordance with some embodiments. More specifically, the second semiconductor material layers 108 exposed by the trenches 152 form nanostructures 108, and the nanostructures 108 are configured to be channel regions in the resulting semiconductor devices 10a in accordance with some embodiments.

The first semiconductor material layers 106 and the cladding layer 118 may be removed by performing one or more etching processes. For example, the cladding layer 118 may be etched to form gaps between the fin structure 104 and the fin isolation structure 122, and the first semiconductor material layers 106 may be removed through the gaps afterwards. The cladding layer 118 may help to remove the first semiconductor material layers 106 and to form the nanostructures 108 more efficiently.

The etching process may include a selective wet etching process, such as APM (e.g., ammonia hydroxide-hydrogen peroxide-water mixture) etching process. In some embodiments, the wet etching process uses etchants such as ammonium hydroxide ($NH_4OH$), TMAH, ethylenediamine pyrocatechol (EDP), and/or potassium hydroxide (KOH) solutions.

Next, a gate structures 168 are formed surrounding the nanostructures 108 and over the nanostructures 108. The gate structures 168 are formed surrounding the nanostructure 108 to form gate-all-around (GAA) transistor structures, as shown in FIG. 2S in accordance with some embodiments. Therefore, the gate control ability may be enhanced.

The capping layer 126a formed between the adjacent gate structures 168 may be a gate isolation structure 126a. The gate structures 168 may be a multi-layered structure. Each of the gate structures 168 may include an interfacial layer, a gate dielectric layer 170, a work function layer, and a gate electrode layer 172.

The interfacial layer may be formed around the nanostructures 108 and on the exposed portions of the base fin structures 105. The interfacial layer may be made of silicon oxide, and the interfacial layer may be formed by thermal oxidation.

The gate dielectric layer 170 may be formed over the interfacial layer, so that the nanostructures 108 are surrounded (e.g. wrapped) by the gate dielectric layer 170. The gate dielectric layer 170 may be made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other applicable high-k dielectric materials, or a combination thereof. The gate dielectric layer 170 may be formed using CVD, ALD, other applicable methods, or a combination thereof.

The work function layer may be conformally formed surrounding the nanostructures 106a and over the nanostructures 108. The work function layer may be a multi-layer structure. The work function layer may be made of metal materials. The metal materials of the work function layer may include N-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), or a combination thereof. The metal materials of the work function layer may include P-work-function metal. The P-work-function metal may include titanium nitride (TiN), tungsten nitride (WN), tantalum nitride (TaN), ruthenium (Ru) or a combination thereof. The work function layer may be formed by using CVD, ALD, other applicable methods, or a combination thereof.

The gate electrode layers 172 may be formed over the gate dielectric layer 164 and filled in the trench 152 and the gaps between the nanostructures 108, so that the nanostructures 108 are surrounded by the gate structures 168 in accordance with some embodiments.

The gate electrode layers 172 are made of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 172 are formed using CVD, ALD, electroplating, another applicable method, or a combination thereof.

With the cladding layer 126a formed between adjacent gate structures 168, the gate electrode layers 172 may be filled with a lower aspect ratio.

Next, a dielectric layer 174 is formed over the gate structures 168, as shown in FIG. 2T in accordance with some embodiments. The dielectric layer 174 may include multi-layers made of multiple dielectric materials, such as Al$_2$O$_3$, ZrO$_2$, silicon oxide, silicon nitride, silicon oxynitride, phosphosilicate glass (PSG), borophosphosilicate glass (BPSG), or other applicable dielectric materials. The dielectric layer 174 may be formed by chemical vapor deposition (CVD), physical vapor deposition, (PVD), atomic layer deposition (ALD), or other applicable processes.

After the dielectric layer 174 is formed, a gate contact structure 176 is formed through the dielectric layer 174 and lands on the gate electrode layer 172, as shown in FIGS. 2T and 2T-1 in accordance with some embodiments. The gate contact structure 176 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The gate contact structure 176 may be formed by a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the gate contact structure 176, and then a planarization process such as a chemical mechanical polishing (CMP) process or an etch back process is optionally performed to remove excess conductive materials. After the planarization process, the top surface of the gate contact structure 176 may be level with the top surface of the dielectric layer 174.

By using the dummy gate structure 128 as a mask layer to pattern the capping layer 126 over the fin isolation structure 122, the capping layer 126 may be self-aligned isolation structure between adjacent gate structures 168. Therefore, misalignment may be prevented and the device area may be reduced. In addition, the gate structure 168 may be formed at a lower aspect ratio.

Many variations and/or modifications may be made to the embodiments of the disclosure. FIGS. 3A-1, 3A-2, 3B-1, 3B-2, 3C are cross-sectional representations of various stages of forming a semiconductor device structure 10b, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 3A-1 in accordance with some embodiments, a portion of the capping layer 126 over the fin isolation structure 122 is completely removed.

Figures 1, 3A:
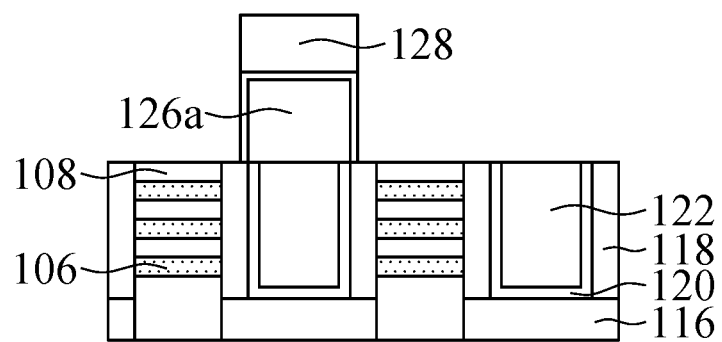
Figures 2, 3A:
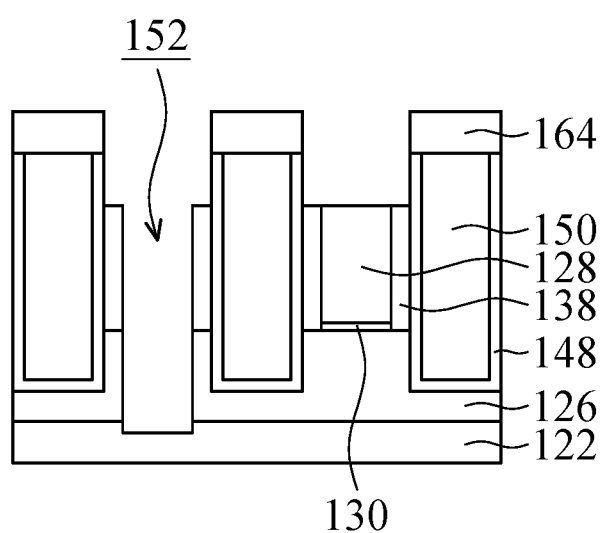

When patterning the capping layer 126, the capping layer 126b remains and the dummy structure 128 over the second semiconductor material layers 108 is completely removed, so that the fin isolation structure 122 is exposed in the trench 152, as shown in FIGS. 3A-1 and 3A-2 in accordance with some embodiments.

Figures 1, 3B:
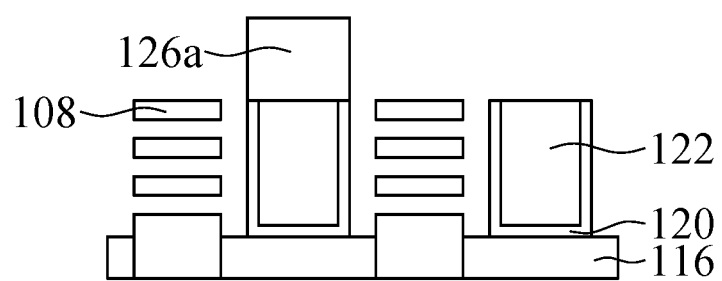
Figures 2, 3B:
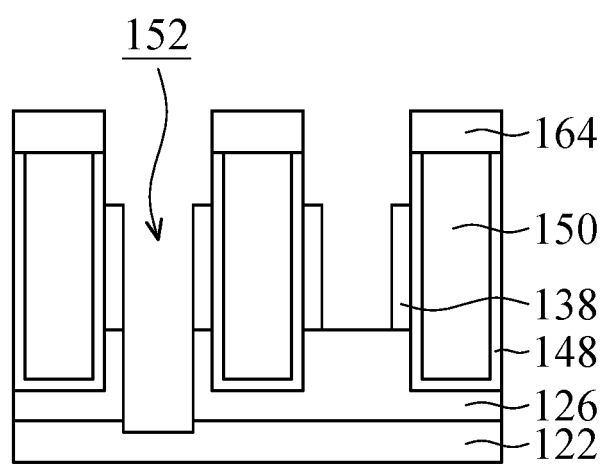
Figure 3C:
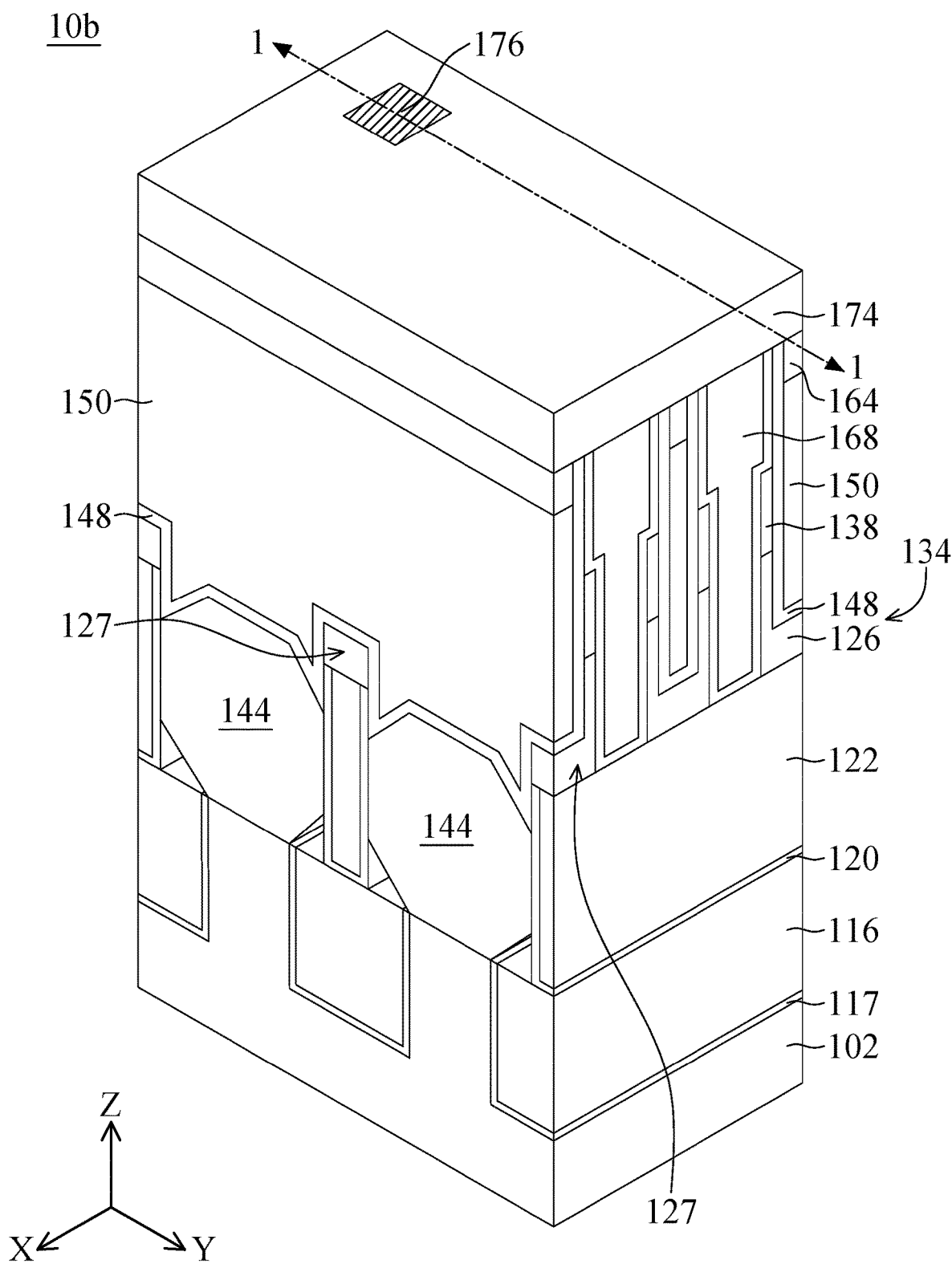
FIG. 3C is a perspective representation of a semiconductor device structure, in accordance with some embodiments of the disclosure.

Next, the dummy gate structure 128 is removed, as shown in FIGS. 3B-1 and 3B-2 in accordance with some embodiments. Afterwards, the gate structure 168 is formed between the spacers 138 and the gate contact structure 176 is formed over the gate structure, as shown in FIG. 3C in accordance with some embodiments. In some embodiments, the gate structure 168 is in contact with the fin isolation structure 122 since the capping layer 126b is completely removed.

The processes and materials of the gate structure 168 and the contact structure 176 may be the same as, or similar to, those used to form the gate structure 168 and the contact structure 176 in the previous embodiments. For the purpose of brevity, the descriptions of these processes are not repeated herein.

By using the dummy gate structure 128 as a mask layer to pattern the capping layer 126 over the fin isolation structure 122, the capping layer 126 may be a self-aligned isolation structure between adjacent gate structures 168. Therefore, misalignment may be prevented and the device area may be reduced. In addition, the gate structure 168 may be formed at a lower aspect ratio. The capping layer 126 may be completely removed.

Figures 1, 4A:
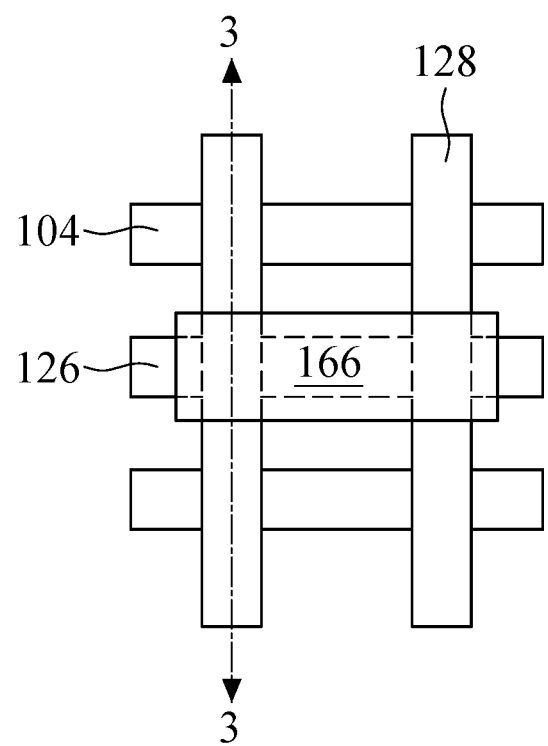
Figures 2, 4A:
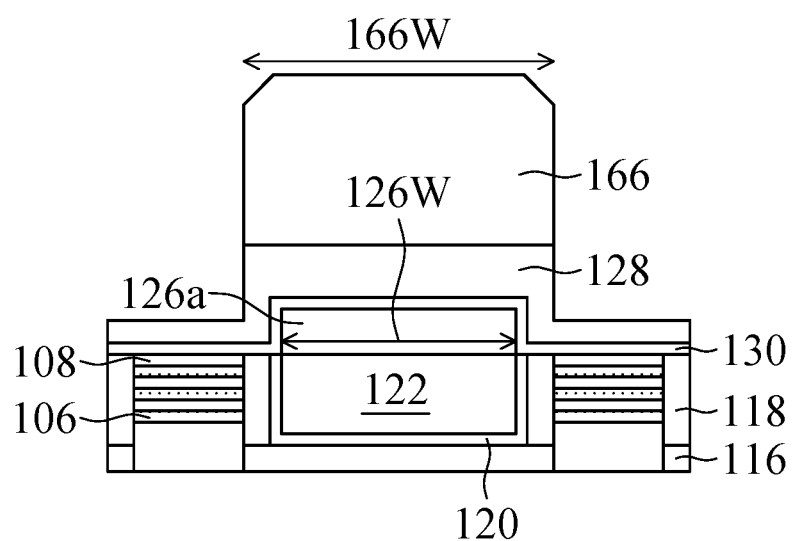
Figure 4B:
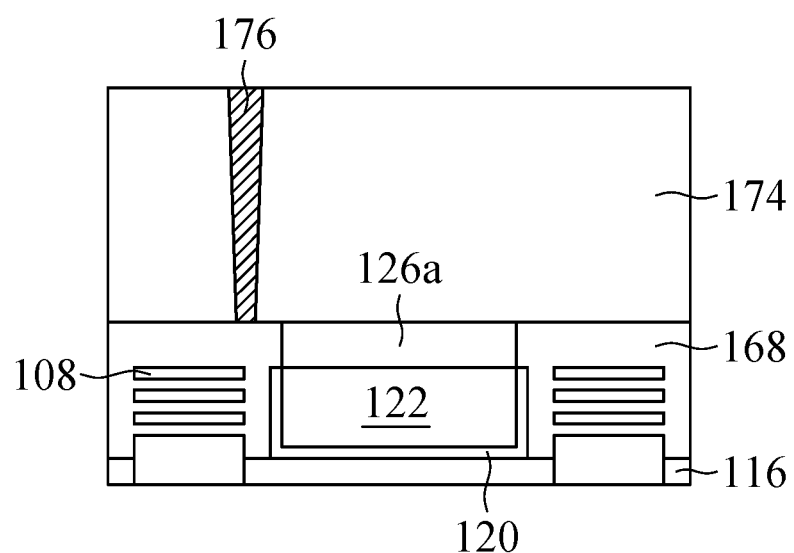

Many variations and/or modifications may be made to the embodiments of the disclosure. FIGS. 4A-2, 4B are cross-sectional representations of various stages of forming a semiconductor device structure 10c. Some processes or devices are the same as, or similar to, those described in the embodiments above, and therefore the descriptions of these processes and devices are not repeated herein. The difference from the embodiments described above is that, as shown in FIGS. 4A-1 and 4A-2 in accordance with some embodiments, the photoresist layer 166 is wider than the capping layer 126.

FIG. 4A-2 shows a cross-sectional representation taken along line 3-3 in FIG. 4A-1. In some embodiments, the photoresist layer 166 has a wider width 166W than the width 126W of the capping layer 126a. Therefore, the dummy gate structure 128 covers the top surface and the sidewalls of the capping layer 126a. The capping layer 126a may be fully protected by the dummy gate structure 128.

Next, the dummy gate structure 128 is removed, and the gate structure 168 is formed surrounding the nanostructures 108 and the gate contact structure 176 is formed over the gate structure 168, as shown in FIG. 4B in accordance with some embodiments. The processes and materials of the gate structure 168 and the contact structure 176 may be the same as, or similar to, those used to form the gate structure 168 and the contact structure 176 in the previous embodiments. For the purpose of brevity, the descriptions of these processes are not repeated herein.

By using the dummy gate structure 128 as a mask layer to pattern the capping layer 126 over the fin isolation structure 122, the capping layer 126 may be a self-aligned isolation structure between adjacent gate structures 168. Therefore, misalignment may be prevented and the device area may be reduced. In addition, the gate structure 168 may be formed at a lower aspect ratio. With the photoresist layer 166 wider than the capping layer 126a, the capping layer 126a may be fully protected by the dummy gate structure 128 during patterning the capping layer 126.

Many variations and/or modifications may be made to the embodiments of the disclosure. FIGS. 5A-2, 5B-5C are cross-sectional representations of various stages of forming a semiconductor device structure 10d. Some processes or devices are the same as, or similar to, those described in the embodiments above, and therefore the descriptions of these processes and devices are not repeated herein. The difference from the embodiments described above is that, as shown in FIGS. 5A-1 and 5A-2 in accordance with some embodiments, the photoresist layer 166 is narrower than the capping layer 126.

Figures 1, 5A:
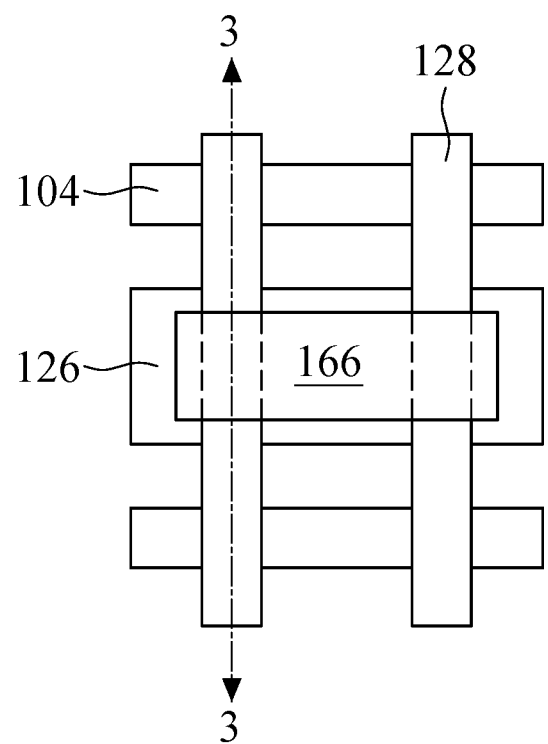
Figures 2, 5A:
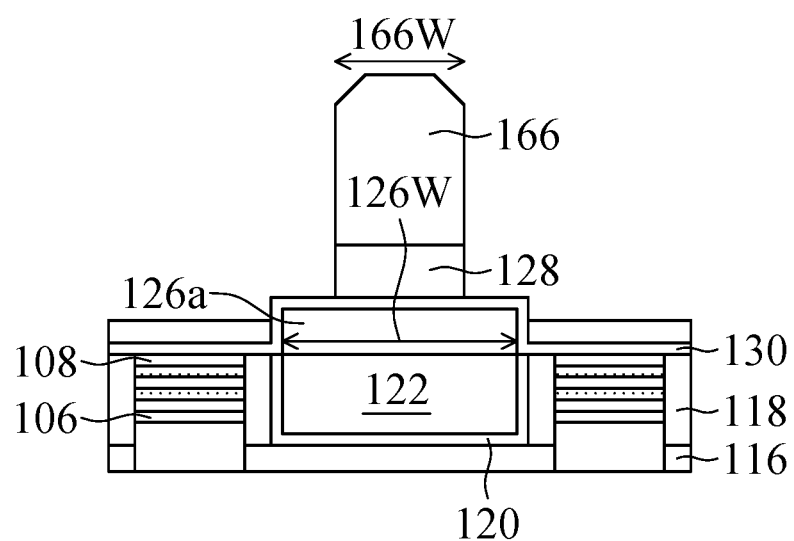

FIG. 5A-2 shows a cross-sectional representation taken along line 3-3 in FIG. 5A-1. In some embodiments, the dummy gate structure 128 partially overlaps the capping layer 126a. In some embodiments, the photoresist layer 166 has a narrower width 166W than the width 126W of the capping layer 126a. The dummy gate structure 128 over the capping layer 126a may be also narrower than the capping layer 126a. Therefore, an edge portion of the capping layer 126a is exposed.

Figure 5B:
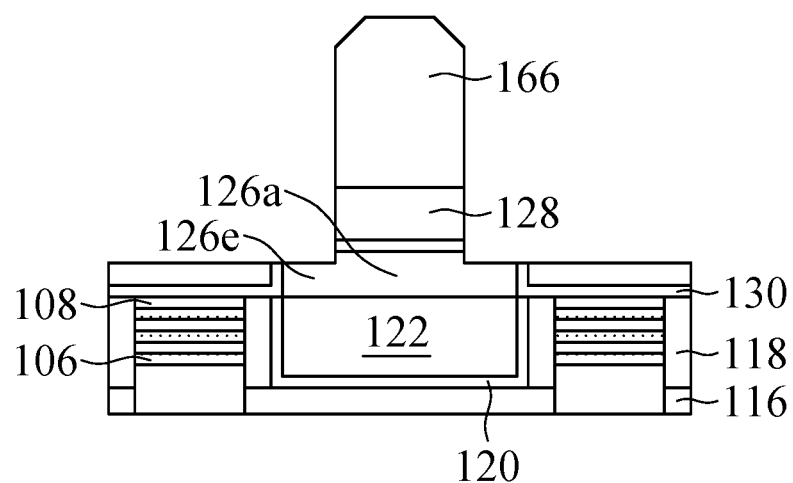

The capping layer 126a is then patterned by using the dummy gate structure 128 as a mask layer, as shown in FIG. 5B in accordance with some embodiments. In some embodiments, the bottom surface of the capping layer 126a is wider than the top surface of the capping layer 126a. In some embodiments, the capping layer 126a has an inverted T-shape in a cross-sectional view. In some embodiments, the capping layer 126a has extending portions 126e at both sides of the bottom portion.

Figure 5C:
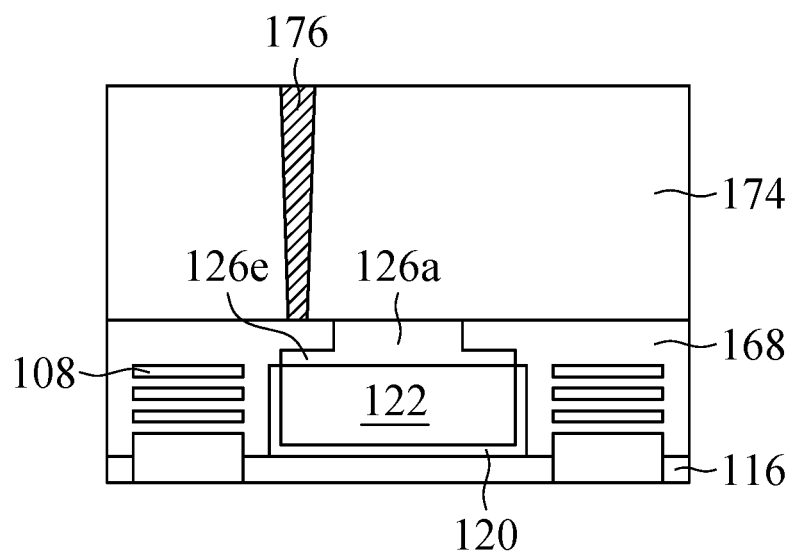

Next, the dummy gate structure 128 is removed, and the gate structure 168 is formed surrounding the nanostructures 108 and the gate contact structure 176 is formed over the gate structure 168, as shown in FIG. 5C in accordance with some embodiments. The processes and materials of the gate structure 168 and the contact structure 176 may be the same as, or similar to, those used to form the gate structure 168 and the contact structure 176 in the previous embodiments. For the purpose of brevity, the descriptions of these processes are not repeated herein.

In some embodiments, the extending portion 126e of the capping layer 126a is under the gate structure 168. In some embodiments, the projection of the gate contact structure 176 overlaps the projection of the extending portion 126e of the capping layer 126a in a top view. Therefore, the horizontal distance between the gate contact structure 176 and the top portion of the capping layer 126a may be further reduced, providing more flexibility for gate contact structure 176 placement.

By using the dummy gate structure 128 as a mask layer to pattern the capping layer 126 over the fin isolation structure 122, the capping layer 126 may be a self-aligned isolation structure between adjacent gate structures 168. Therefore, misalignment may be prevented and the device area may be reduced. In addition, the gate structure 168 may be formed at a lower aspect ratio. With the photoresist layer 166 narrower than the capping layer 126a, narrower top portion of the capping layer 126a may provide more flexibility for gate contact structure 176 placement.

Figure 6:
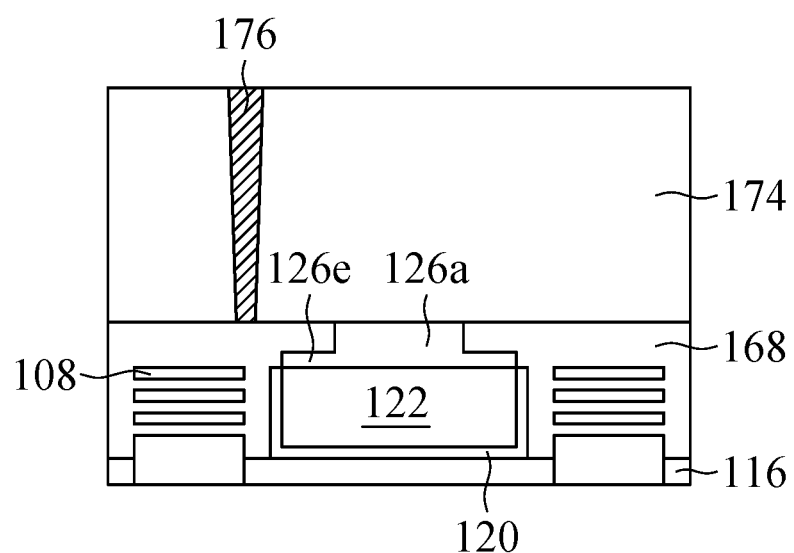
FIG. 6 is a cross-sectional representation of a semiconductor device structure, in accordance with some embodiments of the disclosure.

Many variations and/or modifications may be made to the embodiments of the disclosure. FIG. 6 is a cross-sectional representation of a stage of forming a semiconductor device structure 10e. Some processes or devices are the same as, or similar to, those described in the embodiments above, and therefore the descriptions of these processes and devices are not repeated herein. The difference from the embodiments described above is that, as shown in FIG. 6 in accordance with some embodiments, the gate contact structure 176 is horizontally separated from the capping layer 126a and the fin isolation structure 120.

In some embodiments, the projection of the gate contact structure 176 is separated from the projection of the extending portion 126e of the capping layer 126a in a top view.

By using the dummy gate structure 128 as a mask layer to pattern the capping layer 126 over the fin isolation structure 122, the capping layer 126 may be a self-aligned isolation structure between adjacent gate structures 168. Therefore, misalignment may be prevented and the device area may be reduced. In addition, the gate structure 168 may be formed at a lower aspect ratio. With the photoresist layer 166 narrower than the capping layer 126a, the gate contact structure 176 may also be horizontally separated from the capping layer 126, which may provide more flexibility for gate contact structure 176 placement.

Many variations and/or modifications may be made to the embodiments of the disclosure. FIGS. 7A-1, 7A-2, 7B-1, 7B-2, 7C are cross-sectional representations of various stages of forming a semiconductor device structure 10f. Some processes or devices are the same as, or similar to, those described in the embodiments above, and therefore the descriptions of these processes and devices are not repeated herein. The difference from the embodiments described above is that, as shown in FIG. 7A-1 in accordance with some embodiments, the dummy gate structure 128 has a remaining portion 128r.

Figures 1, 7A:
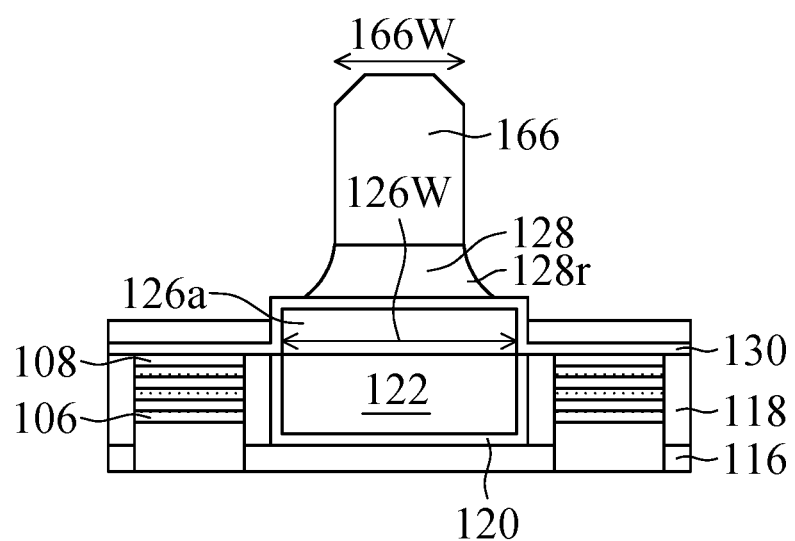
Figures 2, 7A:
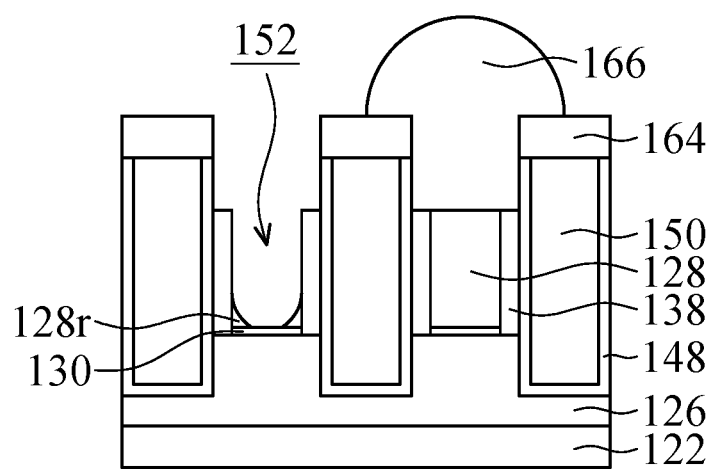

In some embodiments as shown in FIGS. 7A-1 and 7A-2, the dummy gate structure 128 may remain between the spacers 138. In some embodiments, the remaining portion 128r has curved sidewalls. With the remaining portion 128r of the dummy gate structure 128, the bottom surface of the dummy gate structure 128 is wider than the top surface of the dummy gate structure 128. In some embodiments, the bottom surface of the dummy gate structure 128 is wider than the bottom surface of the photoresist layer 166.

Figures 1, 7B:
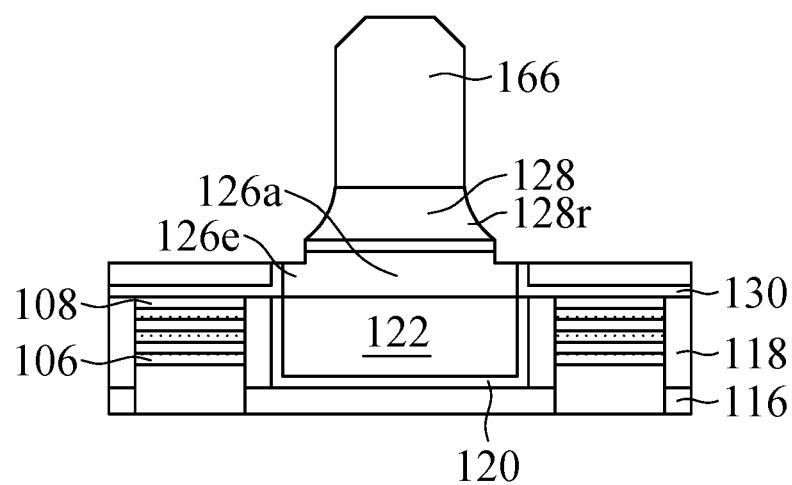
Figures 2, 7B:
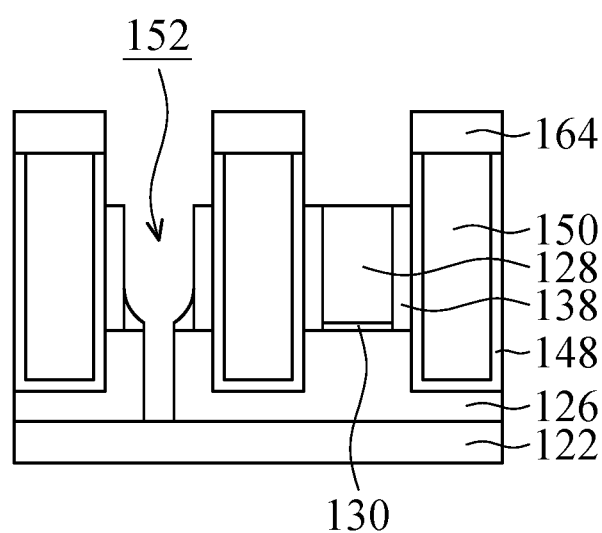

Next, the capping layer 126a is then patterned by using the dummy gate structure 128 as a mask layer, as shown in FIG. 7B-1 in accordance with some embodiments. In some embodiments, the bottom surface of the capping layer 126a is wider than the top surface of the capping layer 126a. In some embodiments, the capping layer 126a has an inverted T-shape in a cross-sectional view. In some embodiments, the capping layer 126a has extending portions 126e at both sides of the bottom portion. In some embodiments, the trench 152 formed between the spacers 138 has a narrower bottom portion.

Figure 7C:
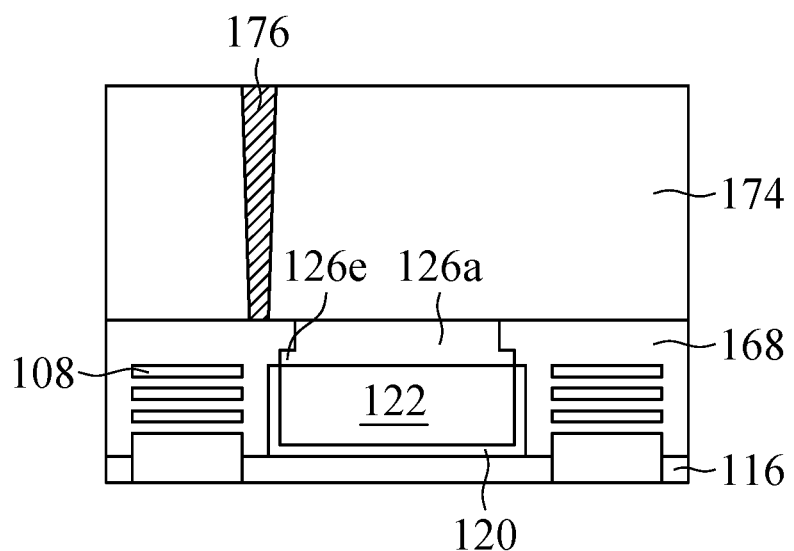

Next, the dummy gate structure 128 is removed, and the gate structure 168 is formed surrounding the nanostructures 108 and the gate contact structure 176 is formed over the gate structure 168, as shown in FIG. 7C in accordance with some embodiments. The processes and materials of the gate structure 168 and the contact structure 176 may be the same as, or similar to, those used to form the gate structure 168 and the contact structure 176 in the previous embodiments. For the purpose of brevity, the descriptions of these processes are not repeated herein.

In some embodiments, the gate contact structure 176 may be formed over the extending portions 126*e* of the capping layer 126 with the gate structure 168 formed therebetween. Therefore, the gate contact structure 176 placement is more flexible.

By using the dummy gate structure 128 as a mask layer to pattern the capping layer 126 over the fin isolation structure 122, the capping layer 126 may be a self-aligned isolation structure between adjacent gate structures 168. Therefore, misalignment may be prevented and the device area may be reduced. In addition, the gate structure 168 may be formed at a lower aspect ratio. The dummy gate structure 128 may have a remain portion 128*r* at both sides and may modify the shape of the capping layer 126*a*. There may be more flexibility for gate contact structure 176 placement.

Figure 8:
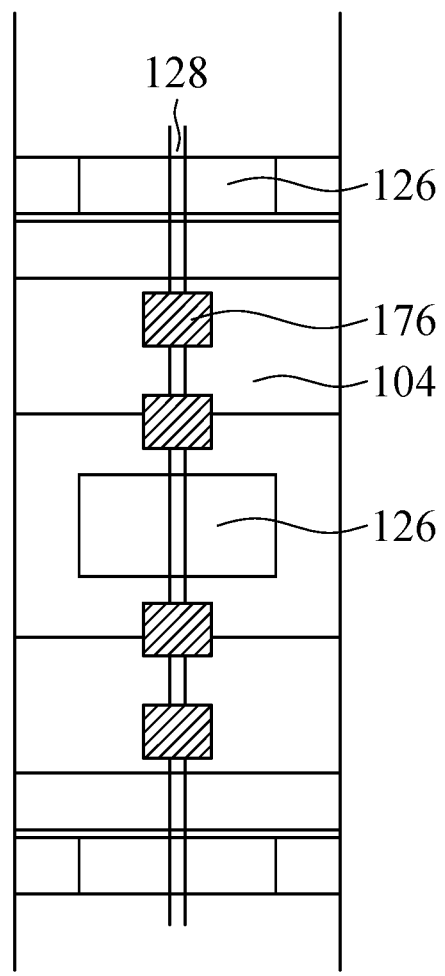
FIG. 8 is a top view of a semiconductor device structure, in accordance with some embodiments of the disclosure.

FIG. 8 is top view of a semiconductor device structure 10*g*. As the device size shrunk, the location of the fin structure 104 may need to be shifted for gate contact structure 176 placement. Using the dummy gate structure 128 as a mask layer to pattern the capping layer 126 over the fin isolation structure 122 may modify the distance between the gate contact structure 176 and the capping layer 126, providing more design and process window.

As described previously, a gate isolation structure 126*a* is self-aligned formed by patterning the capping layer 126 over the fin isolation structure 122 using the dummy gate structure 128 as a mask layer. The distance between the gate contact structure 176 and the capping layer 126 may be modified, and there may be more flexibility to place gate contact structure 176 for lower resistance. In some embodiments as shown in FIG. 3A-1, the exposed portion 126*b* of the capping layer 126 is completely removed when patterning the capping layer 126. In some embodiments as shown in FIG. 4A-2, the dummy gate structure 128 is wider than the capping layer 126*a*, and the capping layer 126*a* is completely protected. In some embodiments as shown in FIG. 5A-2, the dummy gate structure 128 is narrower than the capping layer 126*a*, and the gate contact structure 176 is formed over the gate structure 168 over the extending portion 126*e* of the capping layer 126. In some embodiments as shown in FIG. 6, the gate contact structure 176 is horizontally separated from the capping layer 126. In some embodiments as shown in FIG. 7A-1, the dummy gate structure 128 has a remaining portion 128*r*, and the shape of the capping layer 126*a* is modified by the remaining portion 128*r* of the dummy gate structure 128. In some embodiments as shown in FIG. 8, the position of the fin structure 104 is shifted.

Embodiments of a semiconductor device structure and a method for forming the same are provided. By patterning the capping layer over the fin isolation structure, the gate isolation structure may be self-aligned formed by the capping layer. The distance between the gate contact structure and the gate isolation structure may be modified, providing more flexibility for gate contact structure placement.

In some embodiments, a method for forming a semiconductor device structure is provided. The method for forming a semiconductor device structure includes forming a fin structure with alternating stacked first semiconductor layers and second semiconductor layers over a substrate. The method for forming a semiconductor device structure also includes forming a cladding layer over the fin structure. The method for forming a semiconductor device structure also includes forming a fin isolation structure beside the cladding layer. The method for forming a semiconductor device structure also includes forming a capping layer over the fin isolation structure. The method for forming a semiconductor device structure also includes forming a dummy gate structure across the capping layer. The method for forming a semiconductor device structure also includes patterning the dummy gate structure. The method for forming a semiconductor device structure also includes patterning the capping layer by using the dummy gate structure as a mask layer. The method for forming a semiconductor device structure also includes removing the dummy gate structure.

In some embodiments, a method for forming a semiconductor device structure is provided. The method for forming a semiconductor device structure includes forming a first fin isolation structure and a second fin isolation structure between nanostructures over a substrate. The method for forming a semiconductor device structure also includes forming a first capping layer over the first fin isolation structure and a second capping layer over the second fin isolation structure. The method for forming a semiconductor device structure also includes forming a dummy gate structure over the nanostructures, the first capping layer, and the second capping layer. The method for forming a semiconductor device structure also includes patterning the dummy gate structure to expose the second capping layer. The method for forming a semiconductor device structure also includes etching the dummy gate structure and the second capping layer. The method for forming a semiconductor device structure also includes removing the dummy gate structure.

In some embodiments, a semiconductor device structure is provided. The semiconductor device structure includes nanostructures formed over a substrate. The semiconductor device structure also includes a gate structure surrounding the nanostructures. The semiconductor device structure also includes a fin isolation structure formed beside nanostructures. The semiconductor device structure also includes a capping layer formed over the fin isolation structure. The semiconductor device structure also includes a gate contact structure formed over the gate structure. The top surface of the capping layer is substantially level with the top surface of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
  forming a fin structure with first semiconductor layers and second semiconductor layers alternating stacked over a substrate;
  forming a cladding layer over the fin structure;
  forming a fin isolation structure beside the cladding layer;
  forming a capping layer over the fin isolation structure;
  forming a dummy gate structure across the capping layer;
  patterning the dummy gate structure;
  patterning the capping layer by using the dummy gate structure as a mask layer; and
  removing the dummy gate structure.

2. The method for forming the semiconductor device structure as claimed in claim 1, wherein a top portion of the capping layer is exposed after patterning the dummy gate structure.

3. The method for forming the semiconductor device structure as claimed in claim 2, wherein the top portion of the capping layer is removed when patterning the capping layer.

4. The method for forming the semiconductor device structure as claimed in claim 1, wherein the dummy gate structure over the capping layer is narrower than the capping layer before the capping layer is patterned.

5. The method for forming the semiconductor device structure as claimed in claim 1, wherein a bottom surface of the dummy gate structure is wider than a top surface of the dummy gate structure after patterning the dummy gate structure.

6. The method for forming the semiconductor device structure as claimed in claim 1, wherein the dummy gate structure has curved sidewalls after patterning the dummy gate structure.

7. The method for forming the semiconductor device structure as claimed in claim 1, wherein sidewalls of the dummy gate structure are vertically aligned with sidewalls of the capping layer after patterning the dummy gate structure.

8. A method for forming a semiconductor device structure, comprising:
  forming a first fin isolation structure and a second fin isolation structure between nanostructures over a substrate;
  forming a first capping layer over the first fin isolation structure and a second capping layer over the second fin isolation structure;
  forming a dummy gate structure over the nanostructures, the first capping layer, and the second capping layer;
  patterning the dummy gate structure to expose the second capping layer;
  etching the dummy gate structure and the second capping layer, wherein the dummy gate structure remains over the nanostructures after etching the dummy gate structure and the second capping layer; and
  removing the dummy gate structure.

9. The method for forming the semiconductor device structure as claimed in claim 8, wherein the dummy gate structure covers the first capping layer after patterning the dummy gate structure.

10. The method for forming the semiconductor device structure as claimed in claim 8, wherein a width of the dummy gate structure over the first capping layer is substantially equal to a width of the first capping layer after patterning the dummy gate structure.

11. The method for forming the semiconductor device structure as claimed in claim 8, wherein the dummy gate structure partially overlaps the first capping layer after patterning the dummy gate structure.

12. The method for forming the semiconductor device structure as claimed in claim 8, further comprising:
  forming a gate structure surrounding the nanostructures;
  forming a gate contact structure over the gate structure.

13. The method for forming the semiconductor device structure as claimed in claim 12, wherein the first capping layer has an extending portion under the gate structure.

14. The method for forming the semiconductor device structure as claimed in claim 8, further comprising:
  forming a cladding layer beside the nanostructures.

15. The method for forming the semiconductor device structure as claimed in claim 14, wherein the cladding layer is between the nanostructures and the first fin isolation structure.

16. A method for forming a semiconductor device structure, comprising:
  forming a fin isolation structure between a first semiconductor stack and a second semiconductor stack;
  forming a capping layer over the fin isolation structure;
  forming a dummy gate structure covering a first portion of the capping layer and exposing a second portion of the capping layer;
  etching the second portion of the capping layer and remaining the first portion of the capping layer; and
  replacing the dummy gate structure with a gate structure, wherein the capping layer has an extending portion under the gate structure.

17. The method for forming the semiconductor device structure as claimed in claim 16, wherein a top surface of the capping layer is substantially level with a top surface of the gate structure.

18. The method for forming the semiconductor device structure as claimed in claim 16, wherein the gate structure surrounds the capping layer and the fin isolation structure.

19. The method for forming the semiconductor device structure as claimed in claim 16, wherein the capping layer has a stepped sidewall.

20. The method for forming the semiconductor device structure as claimed in claim 16, further comprising:
  forming a gate contact structure over the gate structure and horizontally separated from the fin isolation structure.

* * * * *